(12) United States Patent
Kobayashi et al.

(10) Patent No.: US 11,012,091 B2
(45) Date of Patent: May 18, 2021

(54) TRANSMITTING APPARATUS AND TRANSMISSION METHOD, RECEIVING APPARATUS AND RECEPTION METHOD, AND PROGRAM

(71) Applicants: Sony Semiconductor Solutions Corporation, Kanagawa (JP); Sony Corporation, Tokyo (JP)

(72) Inventors: Seiji Kobayashi, Kanagawa (JP); Masanori Sato, Tokyo (JP); Nabil Loghin, Stuttgart (DE); Toshihiro Fujiki, Kanagawa (JP); Ryoji Ikegaya, Tokyo (JP); Hiroyuki Kamata, Kanagawa (JP); Yusuke Yoneyama, Tokyo (JP); Kimiya Kato, Tokyo (JP); Akira Endo, Kanagawa (JP); Sawako Kiriyama, Kanagawa (JP); Hiroyuki Mita, Saitama (JP); Hideshi Motoyama, Kanagawa (JP); Hiroshi Aoki, Kanagawa (JP); Daisuke Kawakami, Kanagawa (JP)

(73) Assignees: SONY CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/474,568

(22) PCT Filed: Feb. 27, 2018

(86) PCT No.: PCT/JP2018/007088
§ 371 (c)(1),
(2) Date: Jun. 28, 2019

(87) PCT Pub. No.: WO2018/168428
PCT Pub. Date: Sep. 20, 2018

(65) Prior Publication Data
US 2019/0393898 A1    Dec. 26, 2019

(30) Foreign Application Priority Data

Mar. 13, 2017   (JP) .............................. JP2017-046992

(51) Int. Cl.
| H03M 13/11 | (2006.01) |
| H03M 13/19 | (2006.01) |
| H04L 1/08  | (2006.01) |

(52) U.S. Cl.
CPC .... H03M 13/1148 (2013.01); H03M 13/1154 (2013.01); H03M 13/1157 (2013.01);
(Continued)

(58) Field of Classification Search
CPC ......... H03M 13/1148; H03M 13/1165; H03M 13/1154; H03M 13/1157
See application file for complete search history.

(56) References Cited

U.S. PATENT DOCUMENTS 8,196,020 B2 *  6/2012  Lee .................... H03M 13/1148
                                                              714/776
9,026,884 B2 *  5/2015  Shinohara ........... H03M 13/356
                                                              714/758
(Continued)

FOREIGN PATENT DOCUMENTS

EP   3 048 735 A1   7/2016
JP   2011-507362 A  3/2011
(Continued)

OTHER PUBLICATIONS

Extended European Search Report dated Nov. 21, 2019 in European Patent Application No. 18767367.8. 13 pages.
(Continued)

*Primary Examiner* — Steve N Nguyen
(74) *Attorney, Agent, or Firm* — Xsensus LLP

(57) ABSTRACT

LDPC coding is executed using a check matrix of an LDPC code whose code length is 736 bits and whose code rate is
(Continued)

1/4, and modulation is executed using a repetition unit that has an LDPC code obtained by the LDPC coding, repeatedly arranged therein. The LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a predetermined table indicating positions of elements of "1" of the information matrix portion for each eight columns. This technique is applicable to, for example, information transmission using the LDPC code.

6 Claims, 22 Drawing Sheets

(52) U.S. Cl.
CPC ....... *H03M 13/1165* (2013.01); *H03M 13/19* (2013.01); *H04L 1/08* (2013.01)

(56) References Cited

U.S. PATENT DOCUMENTS

| | | | | |
|---|---|---|---|---|
| 2005/0066262 A1* | 3/2005 | Eroz | ................... | H03M 13/118 714/800 |
| 2012/0179948 A1* | 7/2012 | Myung | ............. | H03M 13/2906 714/752 |
| 2013/0227378 A1* | 8/2013 | Yamamoto | ......... | H03M 13/1165 714/776 |
| 2013/0297992 A1* | 11/2013 | Yamamoto | ........ | H03M 13/2906 714/776 |
| 2016/0294417 A1* | 10/2016 | Suzuki | ................. | H04L 1/0041 |

FOREIGN PATENT DOCUMENTS

| | | |
|---|---|---|
| JP | 2012-15687 | 1/2012 |
| WO | 2015/041074 A1 | 3/2015 |

OTHER PUBLICATIONS

Mediatek Inc, "Compact QC-LDPC design", 3GPP TSG-RAN WG1 NR, R1-1702733, Feb. 13-17, 2017, 7 pages.

Nokia, Alcatel-Lucent Shanghai Bell, "LDPC design for eMBB data", 3GPP TSG-RAN WG1 Meeting #88, R1-1703100, Feb. 13-17, 2017, 14 pages.

ETSI Technical Specification, "Short Range Devices; Low Throughput Networks (LTN); Protocols for radio interface A", ETSI TS 103 357, V1.1.1, Jun. 4, 2018, 113 pages.

LAN/MAN Standards Committee of the IEEE Computer Society, P802.15.4w(TM)/DF4 Draft Standard for Amendment for a Low Power Wide Area Network (LPWAN) extension to the LECIM Physical layer (PHY), Nov. 2018, 42 pages.

International Search Report and Written Opinion dated Apr. 10, 2018 for PCT/JP2018/007088 filed on Feb. 27, 2018, 8 pages including English Translation of the International Search Report.

Wang et al., "Design of Short Quasi-Cyclic LDPC Codes for Next Generation Broadcast Wireless Systems", Vehicular Technology Conference 2016 IEEE 83rd, Jul. 7, 2016, 4 pages.

Zhang et al., "Short-Block LDPC Codes Design with Semi-Random Parity-Check Matrix", 3rd International Conference on Computer Science and Network Technology (ICCSNT) (2013), Dec. 1, 2014, pp. 884-888.

\* cited by examiner

FIG. 21

$$H_T = \begin{pmatrix} 1 & & & & & 0 \\ 1\,1 & & & & & \\ & 1\,1 & & & & \\ & & \ddots & & & \\ & & & 1\,1 & & \\ & & & & 1\,1 & \\ 0 & & & & & 1\,1 \end{pmatrix}$$

PARITY MATRIX $H_T$

TRANSMITTING APPARATUS AND TRANSMISSION METHOD, RECEIVING APPARATUS AND RECEPTION METHOD, AND PROGRAM

CROSS-REFERENCE TO RELATED APPLICATIONS

The present application is based on PCT filing PCT/JP2018/007088, filed Feb. 27, 2018, which claims priority to JP 2017-046992, filed Mar. 13, 2017, the entire contents of each are incorporated herein by reference.

TECHNICAL FIELD

This technique relates to a transmitting apparatus and a transmission method, a receiving apparatus and a reception method, and programs, and more particularly to a transmitting apparatus and a transmission method, a receiving apparatus and a reception method, and programs that each enable securing of excellent communication quality in information transmission using, for example, a low density parity check (LDPC) code.

BACKGROUND ART

An LDPC code has a high error correction ability and has recently been widely employed in transmission schemes for digital broadcasting and the like such as, for example, Digital Video Broadcasting (DVB)-S.2 in Europe and the like, and Advanced Television Systems Committee (ATSC) 3.0 etc. in the U.S. and the like.

Moreover, a mobile communication employing the LDPC code is proposed (see, e.g., PTL 1).

The LDPC code has a nature for the smallest distance to be proportional to the code length, therefore the feature thereof is its excellent block error probability property, and furthermore the advantages thereof include the fact that the what-is-called error floor phenomenon observed in the decoding property for a turbo signal or the like substantially does not occur and the like.

CITATION LIST

Patent Literature

[PTL 1]
JP-T-2011-507362

SUMMARY

Technical Problem

The above information transmission using the LDPC code is spreading worldwide and securing of excellent communication (transmission) quality is required thereto.

This technique was conceived in view of the above circumstances and enables securing of excellent communication quality in information transmission using the LDPC code.

Solution to Problem

A transmitting apparatus or a first program of this technique is a transmitting apparatus or a program to cause a computer to function as this transmitting apparatus, that includes: a coding part that executes LDPC coding using a check matrix of an LDPC code whose code length is 736 bits and whose code rate is 1/4, and a modulating part that executes modulation using a repetition unit having an LDPC code obtained by the LDPC coding, repeatedly arranged therein, in which the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table that indicates positions of elements of "1" of the information matrix portion for each eight columns and is

| 1 | 7 | 90 | 172 | 209 | 359 | 401 | 420 | 483 | 487 |
|---|---|----|-----|-----|-----|-----|-----|-----|-----|
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412. | | | | | | | |

A transmission method of this technique is a transmission method including: executing LDPC coding using a check matrix of an LDPC code whose code length is 736 bits and whose code rate is 1/4, and executing modulation using a repetition unit that has an LDPC code obtained by the LDPC coding, repeatedly arranged therein, in which the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table indicating positions of elements of "1" of the information matrix portion for each eight columns and is

| 1 | 7 | 90 | 172 | 209 | 359 | 401 | 420 | 483 | 487 |
|---|---|----|-----|-----|-----|-----|-----|-----|-----|
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |

-continued

| | | |
|---|---|---|
| 26 | 62 | 244 |
| 8 | 246 | 482 |
| 15 | 72 | 91 |
| 43 | 69 | 390 |
| 127 | 186 | 506 |
| 55 | 81 | 412. |

In the transmitting apparatus, the transmission method, and the first program of this technique, LDPC coding is executed using a check matrix of an LDPC code whose code length is 736 bits and whose code rate is 1/4, and modulation is executed using a repetition unit having an LDPC code obtained by the LDPC coding, repeatedly arranged therein. The LDPC code includes information bits and parity bits, the check matrix includes an information matrix portion corresponding to the information bits and a parity matrix portion corresponding to the parity bits, and the parity matrix portion has a stepwise structure. The information matrix portion is indicated by a check matrix initial value table, and the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412. | | | | | | | |

A receiving apparatus or a second program of this technique is a receiving apparatus or a program to cause a computer to function as this receiving apparatus including: a demodulating part that demodulates a signal transmitted from a transmitting apparatus that includes a coding part that executes LDPC coding using a check matrix of an LDPC code whose code length is 736 bits and whose code rate is 1/4, and a modulating part that executes modulation using a repetition unit having an LDPC code obtained by the LDPC coding, repeatedly arranged therein, in which the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412, | | | | | | | | and a decoding part that decodes the LDPC code obtained by demodulating the signal using the check matrix.

A reception method of this technique is a reception method including: demodulating a signal transmitted from a transmitting apparatus that includes a coding part that executes LDPC coding using a check matrix of an LDPC code whose code length is 736 bits and whose code rate is 1/4, and a modulating part that executes modulation using a repetition unit having an LDPC code obtained by the LDPC coding, repeatedly arranged therein, in which the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412, | | | | | | | | and decoding the LDPC code obtained by demodulating the signal using the check matrix.

In the receiving apparatus, the reception method, and the second program of this technique, a signal is demodulated, that is transmitted from a transmitting apparatus that includes a coding part that executes LDPC coding using a check matrix of an LDPC code whose code length is 736 bits and whose code rate is 1/4, and a modulating part that executes modulation using a repetition unit having an LDPC code obtained by the LDPC coding, repeatedly arranged therein, in which the LDPC code includes information bits and parity bits, the check matrix includes an information matrix portion corresponding to the information bits and a parity matrix portion corresponding to the parity bits, the parity matrix portion has a stepwise structure, of which the information matrix portion is indicated by a check matrix initial value table, and the check matrix initial value table is a table indicating positions of elements of "1" of the information matrix portion for each eight columns and is

| 1   | 7   | 90  | 172 | 209 | 359 | 401 | 420 | 483 | 487 |
|-----|-----|-----|-----|-----|-----|-----|-----|-----|-----|
| 57  | 164 | 192 | 197 | 284 | 307 | 174 | 356 | 408 | 425 |
| 22  | 50  | 191 | 379 | 385 | 396 | 427 | 445 | 480 | 543 |
| 32  | 49  | 71  | 234 | 255 | 286 | 297 | 312 | 537 | 550 |
| 30  | 70  | 88  | 111 | 176 | 201 | 283 | 322 | 419 | 499 |
| 86  | 94  | 177 | 193 | 266 | 368 | 373 | 389 | 475 | 529 |
| 134 | 223 | 242 | 254 | 285 | 319 | 403 | 496 | 503 | 534 |
| 18  | 84  | 106 | 165 | 170 | 199 | 321 | 355 | 386 | 410 |
| 129 | 158 | 226 | 269 | 288 | 316 | 397 | 413 | 444 | 549 |
| 33  | 113 | 133 | 194 | 256 | 305 | 318 | 380 | 507 |     |
| 317 | 354 | 402 |     |     |     |     |     |     |     |
| 53  | 64  | 374 |     |     |     |     |     |     |     |
| 83  | 314 | 378 |     |     |     |     |     |     |     |
| 162 | 259 | 280 |     |     |     |     |     |     |     |
| 166 | 281 | 486 |     |     |     |     |     |     |     |
| 185 | 439 | 489 |     |     |     |     |     |     |     |
| 119 | 156 | 224 |     |     |     |     |     |     |     |
| 26  | 62  | 244 |     |     |     |     |     |     |     |
| 8   | 246 | 482 |     |     |     |     |     |     |     |
| 15  | 72  | 91  |     |     |     |     |     |     |     |
| 43  | 69  | 390 |     |     |     |     |     |     |     |
| 127 | 186 | 506 |     |     |     |     |     |     |     |
| 55  | 81  | 412,|     |     |     |     |     |     |     | and the LDPC code obtained by demodulating the signal is decoded using the check matrix.

In addition, the transmitting apparatus and the receiving apparatus may each be an independent apparatus or may each be an internal block constituting one apparatus.

The programs can each be provided by being transmitted through a transmission medium or by being recorded on a recording medium.

Advantageous Effects of Invention

According to this technique, excellent communication quality can be secured in information transmission using the LDPC code.

In addition, the effect described herein is not necessarily limited and may be any one of the effects described in this disclosure.

BRIEF DESCRIPTION OF DRAWINGS

FIG. 21 is a diagram depicting an example of a parity matrix $H_T$ of the check matrix H.

FIG. 23 is a diagram depicting a check matrix initial value table indicating the check matrix of a new LDPC code whose code length N is 736 bits and whose code rate r is 1/4.

DESCRIPTION OF EMBODIMENT

<New Communication Scheme of LPWA Communication>

An overview of a new communication scheme of low power wide area (LPWA) communication to which this technique is applied will first be described.

The LPWA communication is wireless communication capable of transmitting information in a wide range from approximately several tens to approximately 100 km with low electric power consumption, and use thereof is spreading for Internet of things (IoT) and the like that each transmit a small amount of information such as sensor information or the like.

In the new communication scheme, a wireless signal is transmitted and received (transmitted) in, for example, a 920-MHz band. In this case, it can be stated that the new communication scheme is one type of wireless communication in the 920-MHz band.

In Japan, the 920-MHz band is a frequency band from which prohibition was lifted in July of 2011 by the Ministry of Internal Affairs and Communications, and is usable for any person without any license. For the wireless communication in the 920-MHz band, however, the maximal continuous transmission time period is limited to four seconds by the specification (Association of Radio Industries and Businesses (ARIB) STD T-108). Moreover, for the wireless communication, when the continuous transmission time period is reduced to be, for example, 0.4 seconds or shorter, the influence is alleviated that is caused by interference exerting on another wireless system using the same one frequency band. It is therefore provided in the ARIB specification for the 920-MHz band that the continuous transmission time period is set to be 0.4 seconds or shorter to thereby enable more channels to be assigned. As a result, in Japan, when the continuous transmission time period is set to be 0.4 seconds or shorter, the transmission and the reception can be executed with a little interference. Moreover, when the continuous transmission time period is further reduced to be 0.2 seconds or shorter, retransmission can be executed with a reduced downtime.

In the new communication scheme, to improve the signal to noise ratio (the S/N ratio) of the received signal on the reception side, for example, the same one packet is transmitted for plural times.

Figure 1:
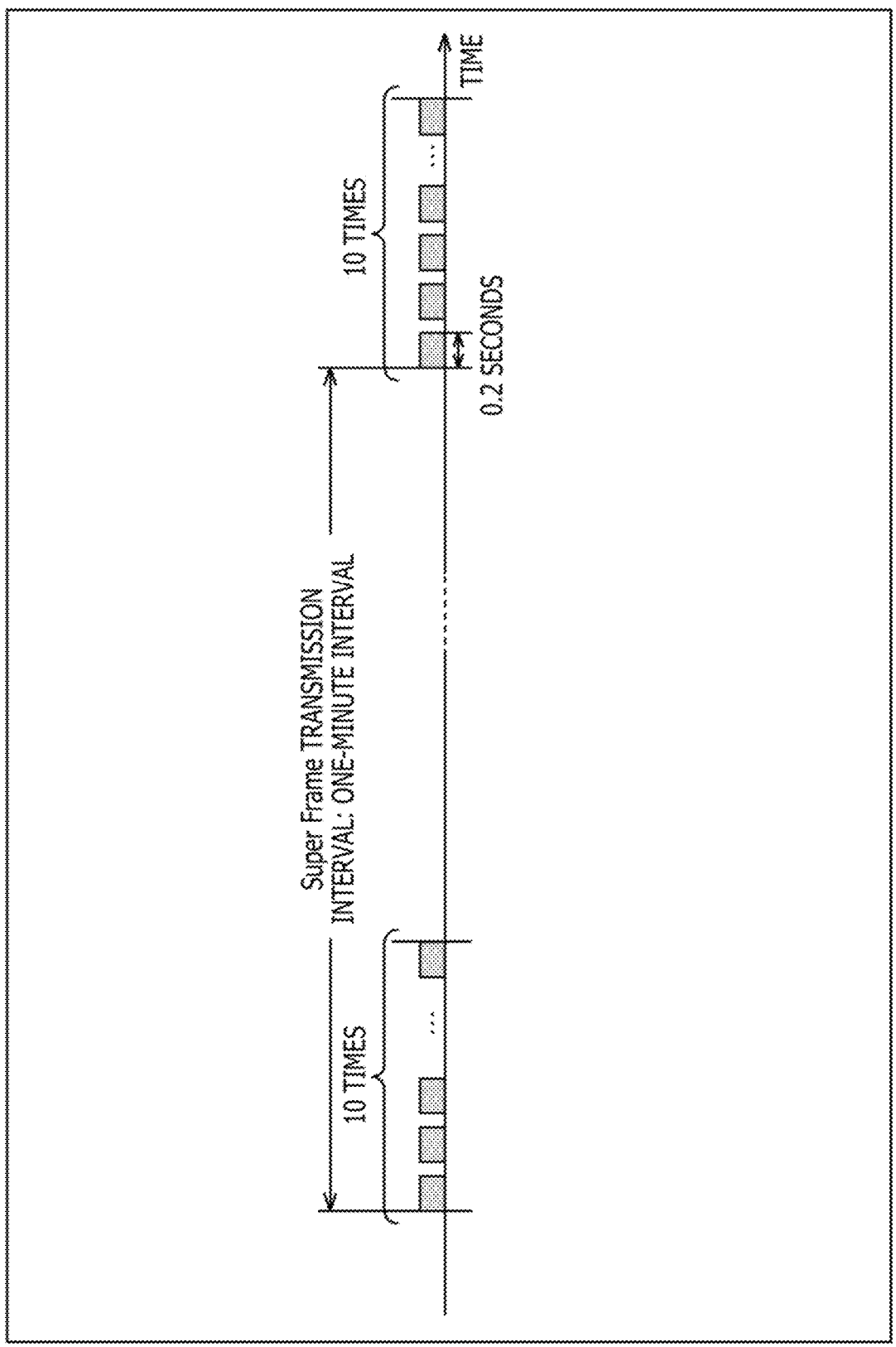
FIG. 1 is a diagram depicting an example where a same one packet is transmitted for plural times in a new communication scheme.

FIG. 1 is a diagram depicting an example where the same one packet is transmitted for plural times in the new communication scheme.

In FIG. 1, a super frame of one minute is set and, during this, the same one packet is transmitted for 10 times. In the new communication scheme, the transmission side executes carrier sensing when the transmission side executes transmission. In the new communication scheme, for the carrier sensing, for example, a one-minute super frame is set as depicted in FIG. 1 for the 10 packet transmission sessions.

Figure 2:
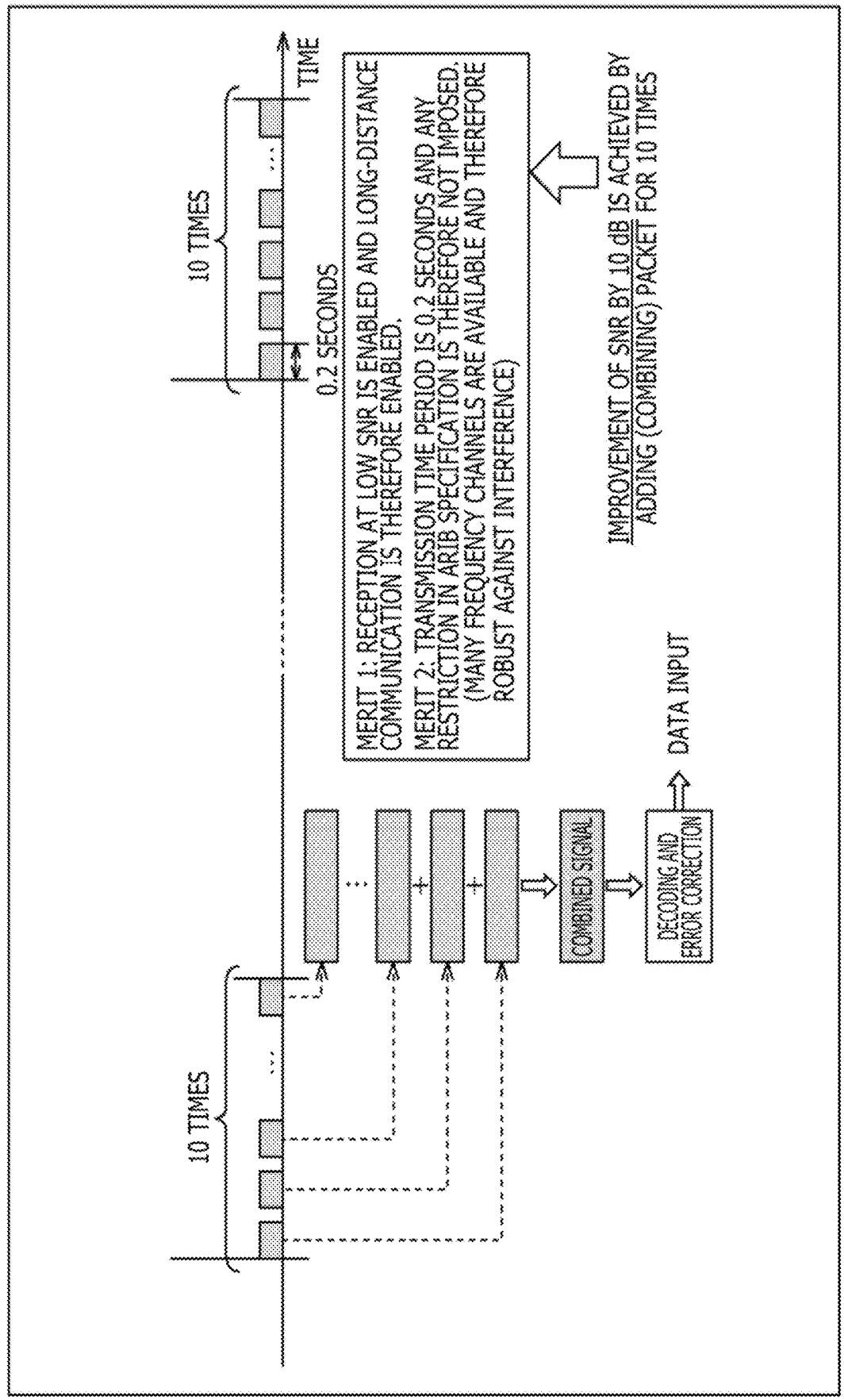
FIG. 2 is a diagram depicting an example of reception of packets on the reception side in the new communication scheme.

FIG. 2 is a diagram depicting an example of reception of the packets on the reception side in the new communication scheme.

The reception side receives 10 packets from the transmission side and, as depicted in FIG. 2, combines (the signals of) these 10 packets to produce a combined signal. The reception side executes decoding (error correction) and the like of the combined signal, thereby extracts data from the combined signal, and outputs the data.

In this manner, the S/N ratio can be improved by producing the combined signal by combining the packets. For example, when 10 packets can be added to (combined with) each other, the S/N ratio can be improved by approximately 10 dB.

In the new communication scheme, therefore, the reception side can obtain the data even when the S/N ratio per one packet is low and longer-distance information transmission is enabled. Moreover, in the new communication scheme, no restriction of the ARIB specification is imposed and more frequency channels are available by setting the transmission time period of the packet to be 0.2 seconds or shorter, or 0.4 seconds or shorter as above.

In the new communication scheme, for example, frequency hopping of using plural carrier frequencies can be executed.

Figure 3:
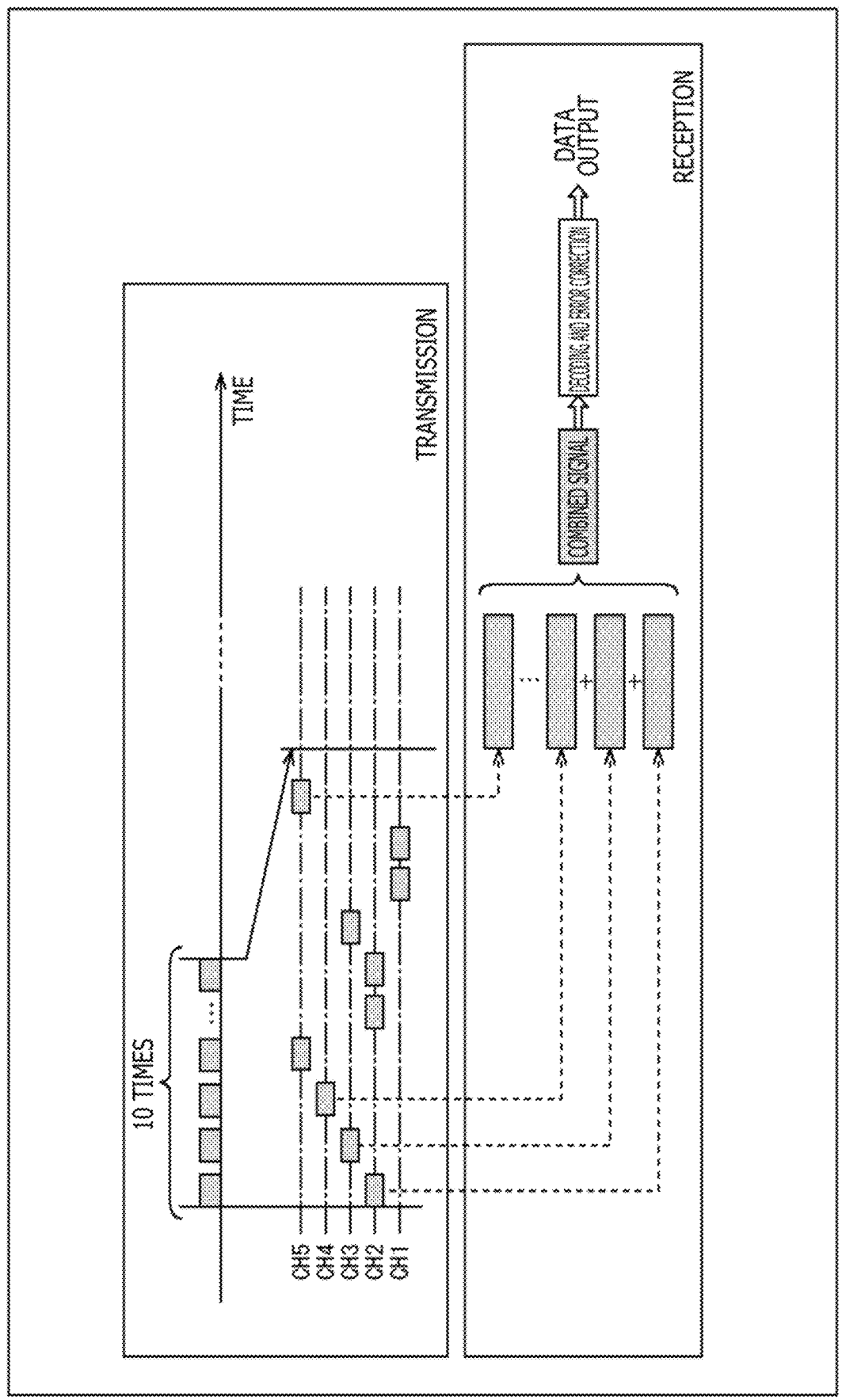
FIG. 3 is a diagram depicting an example of frequency hopping.

FIG. 3 is a diagram depicting an example of the frequency hopping.

In the frequency hopping in FIG. 3, five channels from CH1 to CH5 are prepared, and each of the packets selects any one of these five channels for its transmission and reception. Such a method is usable as the selection approach for the channel, as a method of increasing the transmission channel number corresponding to the transmission order, a method of determining the transmission channel number in accordance with a predetermined equation, a method of randomly selecting the transmission channel number or the like. According to the above frequency hopping, occurrence of any interference can be suppressed.

Figure 4:
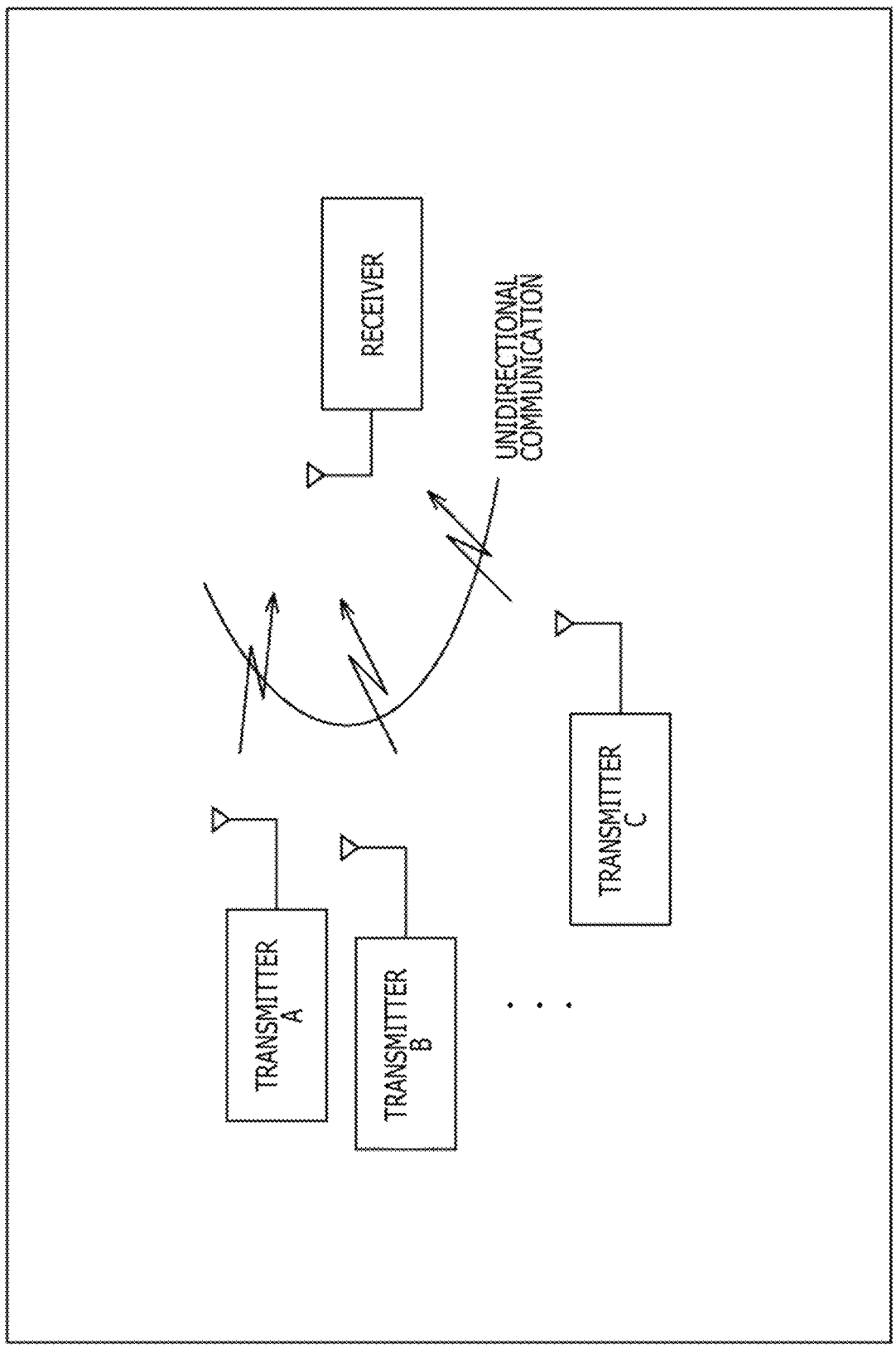
FIG. 4 is a diagram depicting an example of a wireless system in which interference may occur.

FIG. 4 is a diagram depicting an example of a wireless system in which interference may occur.

The wireless system in FIG. 4 includes plural transmitters (a transmitter A to a transmitter C) and one receiver.

In the wireless system in FIG. 4, the plural transmitters may transmit wireless signals at the same time at the same one carrier frequency. When the plural transmitters transmit wireless signals at the same time at the same one carrier frequency, interference occurs in the receiver and the receiver has difficulty in correctly receiving the wireless signal from each of the plural transmitters.

The frequency hopping in FIG. 3 is therefore applied to the wireless system in FIG. 4. In this case, the possibility for the carrier frequencies to be equal to each other can be reduced and, corresponding to this, occurrence of any interference can be suppressed.

In the wireless system in FIG. 4, however, the communication is unidirectional and, even when the frequency hopping is executed, the carrier frequencies of the plural transmitters may be equal to each other and it is difficult to completely avoid occurrence of any interference.

Figure 5:
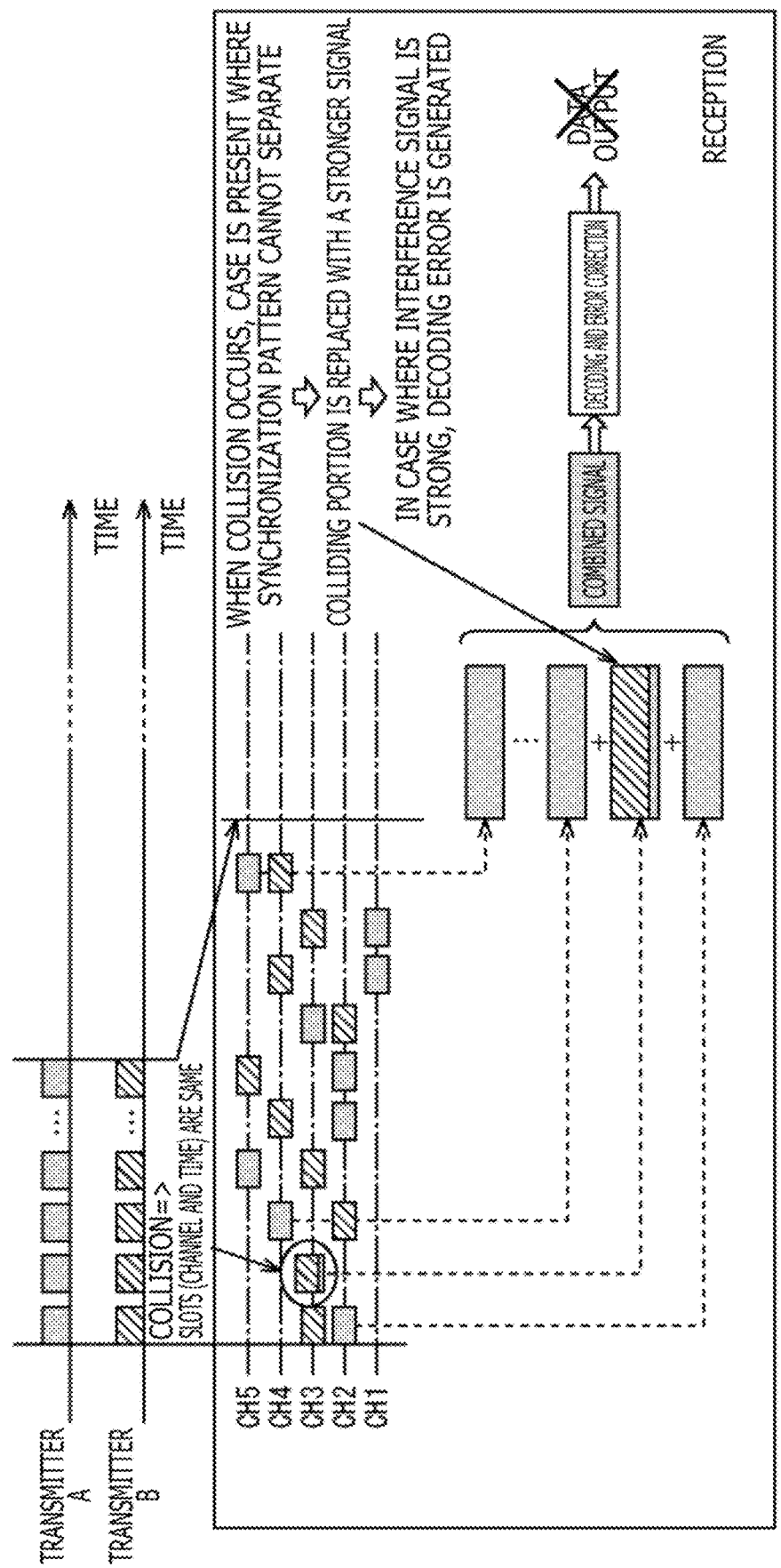
FIG. 5 is a diagram depicting an example of interference occurring in the case where the frequency hopping is executed in the wireless system.

FIG. 5 is a diagram depicting an example of interference occurring in the case where the frequency hopping is executed in the wireless system.

In FIG. 5, the frequency hopping is executed in each of the transmitters A and B while the carrier frequency of one certain packet transmitted from the transmitter A and that of another certain packet transmitted from the transmitter B become equal to each other at the same time of day and the wireless signals (the packets) of the transmitters A and B collide with each other. When a collision of wireless signals with each other occurs as above, the receiver cannot separate the packets from different transmitters, from each other and an error may occur in the finally obtained data.

For example, it is assumed in FIG. 5 that the receiver receives the wireless signal from the transmitter A. It is further assumed that one packet of the packets transmitted from the transmitter A collides with a packet transmitted from the transmitter B and the wireless signal transmitted from the transmitter B is stronger than the wireless signal transmitted from the transmitter A. In this case, the receiver combines the colliding packet of the transmitter B as the packet from the transmitter A. An error therefore occurs in the combined signal and the data may be unable to be extracted. In this case, the transmission and reception of the 10 packets in the super frame may all be wasted.

In the bidirectional communication, each of the transmitters A and B, and the receiver execute delivery and reception of necessary information mutually therebetween and thereby, for example, retransmission can be urged. In the unidirectional communication, however, it is difficult to supply any information from the reception side to the transmission side and it is therefore difficult to take any countermeasure against the collision of packets, that can be taken in the bidirectional communication.

<Position Notification System>

Figure 6:
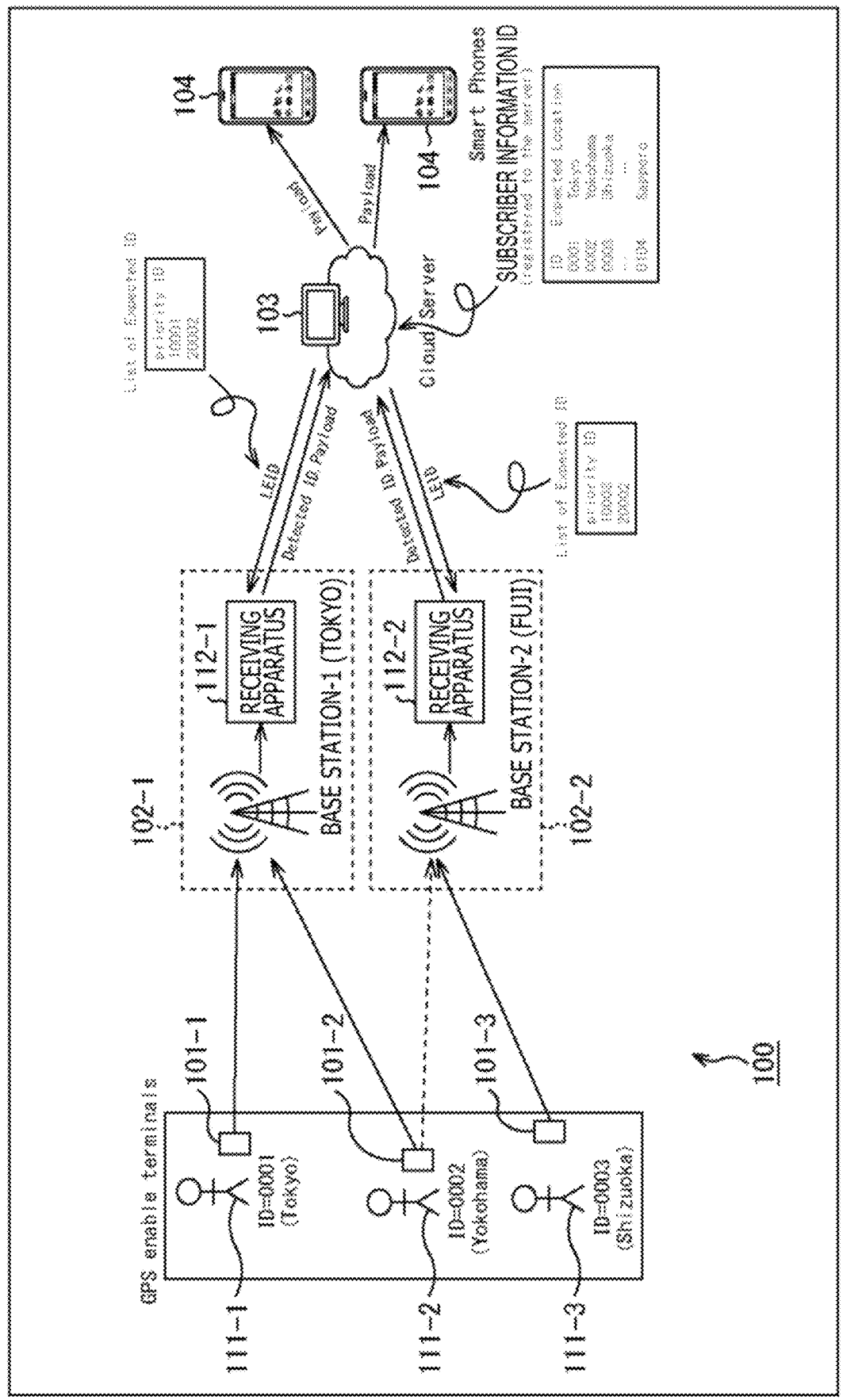
FIG. 6 is a diagram depicting an exemplary configuration of a position notification system that is an embodiment of the wireless system to which this technique is applied.

FIG. 6 is a diagram depicting an exemplary configuration of a position notification system that is an embodiment of the wireless system to which this technique is applied.

The position notification system 100 in FIG. 6 includes transmitting apparatuses 101 (101-1 to 101-3), base stations 102 (102-1 and 102-2), a cloud server 103, and an information processing terminal 104.

In the position notification system 100, the transmitting apparatus 101 executes wireless communication in the new communication scheme with the base station 102 and a position monitoring service of monitoring the position of the transmitting apparatus 101 is thereby provided.

The transmitting apparatus 101 is an embodiment of the transmitting apparatus to which this technique is applied and transmits the position information indicating the position of this transmitting apparatus 101 using a wireless signal. The base station 102 includes a receiving apparatus 112. The receiving apparatus 112 is an embodiment of the receiving apparatus to which this technique is applied, receives the wireless signal from the transmitting apparatus 101, thereby obtains the position information of the transmitting apparatus 101, and provides the position information and the like to the cloud server 103. The base station 102 including the receiving apparatus 112 therefore functions as a relay station that relays information transmitted from the transmitting apparatus 101 and that transmits this information to the cloud server 103. The cloud server 103 manages various types of information such as the position information of each of the transmitting apparatuses 101 and provides, for example, a service of notifying a user of the position of the transmitting apparatus 101. For example, the information processing terminal 104 operated by a user desiring to know the position of the transmitting apparatus 101 accesses the cloud server 103, obtains the position information of the transmitting apparatus 101, and notifies the user of the position of the transmitting apparatus 101 by, for example, displaying the position together with map data and the like.

The transmitting apparatus 101 is caused to be brought with an object that the user desires to monitor the position thereof such as, for example, an elderly person or the like.

The transmitting apparatus 101 includes a position sensor that obtains the position information of this transmitting apparatus 101 using, for example, the global navigation satellite system (GNSS). In other words, the transmitting apparatus 101 has a reception mechanism that receives, for example, a global positioning system (GPS) signal from a GPS satellite, as the position sensor, and obtains the position information (such as, for example, the degree of latitude and the degree of longitude, and the like) relating to this transmitting apparatus 101 when necessary. The transmitting apparatus 101 transmits the position information as a wireless signal when necessary.

In addition, various types of sensor other than the position sensor are mounted on the transmitting apparatus 101, and the transmitting apparatus 101 can transmit each of pieces of sensor information output by the sensors using a wireless signal. For example, a sensor sensing biological information such as the pulse, the heart rate, and the like, a sensor sensing the temperature, the humidity, and the like, a sensor detecting opening and closing of a shutter, a door, and the like, and the like can be mounted on the transmitting apparatus 101.

In FIG. 6, the transmitting apparatus 101-1 is brought with an elderly person 111-1 in Tokyo, the transmitting apparatus 101-2 is brought with an elderly person 111-2 in Yokohama, and the transmitting apparatus 101-3 is brought with an elderly person 111-3 in Shizuoka.

Moreover, the transmitting apparatus 101 has unique identification information (ID). For example, in FIG. 6, the identification information of the transmitting apparatus 101-1 is 0001 (ID=0001), the identification information of the transmitting apparatus 101-2 is 0002 (ID=0002), and the identification information of the transmitting apparatus 101-3 is 0003 (ID=0003). The identification information of the transmitting apparatus 101 is registered in the cloud server 103.

In addition, the object to be monitored for its position is optional. For example, the object to be monitored for its position may be a child, may be an animal (a pet) such as a dog, a cat, or the like, may be an employee of a company, or the like. The three transmitting apparatuses 101 are depicted in FIG. 6 while the number of the transmitting apparatuses 101 is optional. The transmitting apparatus 101 may be configured as a dedicated apparatus but may be incorporated in a portable information processing apparatus such as, for example, a mobile phone or a smartphone.

The base station 102 may be any equipment. For example, the base station 102 may be a dedicated facility or building. Moreover, for example, the base station 102 may be equipment capable of being installed on a roof, a house top, or the like of a construction such as an ordinary building, an ordinary condominium, an ordinary house. Moreover, for example, the base station 102 may be portable equipment capable of being brought with a user, being installed in a mobile body such as an automobile or the like.

The plural base stations 102 are installed. For example, in the case in FIG. 6, the base station 102-1 is set in Tokyo and the base station 102-2 is set in Fuji. In FIG. 6, the two base stations 102 are depicted while the number of the base stations 102 is optional.

The base station 102 includes the receiving apparatus 112. The receiving apparatus 112 receives the wireless signal from the transmitting apparatus 101 and provides the information (data) included in the wireless signal to the cloud server 103. Moreover, the receiving apparatus 112 obtains from the cloud server 103 the necessary information such as a parameter set as wireless format information to determine the wireless format of the wireless communication (such as, for example, the modulation rate of the wireless signal, turning on or off of the frequency hopping, and the like). The method for the receiving apparatus 112 to obtain the information from the cloud server 103 is optional.

The configuration of the cloud server 103 is optional and may be configured by, for example, an optional number of servers, an optional number of networks, and the like. The plural cloud servers 103 may be disposed.

In the position notification system 100, the transmitting apparatus 101 makes a setting for the frequency hopping on the basis of the identification information (ID) of this transmitting apparatus 101. In other words, the transmitting apparatus 101 sets the transmission timing and the transmission frequency of each of the packets on the basis of the identification information, and transmits the packets on the basis of this setting. Occurrence of any interference can be suppressed by executing the transmission using the frequency hopping as above. In short, the information can more reliably be transmitted.

Moreover, the transmitting apparatus 101 can vary the pattern of the transmission timing and the transmission frequency for each of the transmitting apparatuses 101 by setting the transmission timing and the transmission frequency on the basis of the identification information. In this case, occurrence of any collision of the packets with each other that are transmitted from the different transmitting apparatuses 101. In short, the information can more reliably be transmitted.

Moreover, the receiving apparatus 112 of the base station 102 obtains the identification information of the transmitting apparatus 101 from the cloud server 103 and executes the reception on the basis of this identification information. In short, the receiving apparatus 112 sets the reception timing and the reception frequency similarly to the setting of the transmission timing and the transmission frequency for the transmitting apparatus 101, on the basis of the identification information. When the receiving apparatus 112 can identify the transmission timing and the transmission frequency of a packet by the identification information of the transmitting apparatus 101, the detection of the packet only has to be executed for the transmission timing and the transmission frequency (in short, the reception timing and the reception frequency only have to be matched with the transmission timing and the transmission frequency) and therefore, even in the case where the S/N ratio is low, the detection of the packet becomes easier. Highly sensitive reception is therefore enabled. In short, the information can more reliably be transmitted. Moreover, any processing such as detection of a packet at an unnecessary timing and in an unnecessary frequency band, and the like does not need to be executed and any increase of the load can thereby be suppressed.

Moreover, a priority degree can be attached to the identification information of the transmitting apparatus 101. In the case where the priority degree is attached to the identification information of the transmitting apparatus 101 obtained from the cloud server 103, the receiving apparatus 112 can execute the reception of the wireless signal (the packet) from the transmitting apparatus 101 identified using the identification information, corresponding to the priority degree of the identification information. In this case, more reliable transmission of the information can be realized.

In addition, the receiving apparatus 112 can supply the information relating to the reception of the wireless signal such as, for example, which transmitting apparatus 101 transmits the wireless signal and when the wireless signal is received, the content of the wireless signal (the data extracted from the wireless signal), and the like, to the cloud server 103 as reception information.

The cloud server 103 registers in advance and manages the information relating to the transmitting apparatus 101 (also referred to as "terminal information") and information relating to the user (also referred to as "subscriber information"). The terminal information can include, for example, the identification information of the transmitting apparatus 101, information relating to the transmission repetition frequency, the main location, and the like. Moreover, the subscriber information can include, for example, information relating to the name, the age, the sex, the address, and the payment of a user (the person receiving the position notification service), identification information, the log-in ID, the password of the used transmitting apparatus, and the like. Each of the terminal information and the subscriber information may surely include any type of information and is not limited to the above example.

Moreover, the cloud server 103 provides the identification information of the transmitting apparatus 101 to the receiving apparatus 112 of each of the base stations 102 (some of or all of the base stations 102) at a predetermined timing or in response to a request from the receiving apparatus 112 or the like. At this time, to each of the base stations 102, the cloud server 103 can supply the identification information of the transmitting apparatus 101 from which the base station 102 is highly likely to receive the wireless signal. In other words, to each of the base stations 102, the cloud server 103 can refrain from supplying the identification information of the transmitting apparatus 101 from which the base station 102 is not likely to receive the wireless signal. Detection of any unnecessary packet by the receiving apparatus 112 of the base station 102 can be reduced and any increase of the load can be suppressed by executing as above.

Moreover, when the number of the transmitting apparatuses 101 to be reception targets for base station 102 is increased, the probability for collision of packets with each other to occur is increased by the amount corresponding to the increase. More exactly describing, any packet is not likely to be delivered from the transmitting apparatus 101 from which any wireless signal is not likely to be received, and the probability for any collision of the packets with each other to actually occur is therefore not increased. In the setting of the reception timing and the reception frequency made in the base station 102, however, the probability for the collision of the packets with each other to occur is therefore increased as the number of the transmitting apparatuses 101 to be received from is increased. In the case where any collision of the packets with each other occurs in the setting of the reception timing and the reception frequency as above, the reception of the packets is not executed. Thus, when even the transmitting apparatuses 101 from which wireless signals are not likely to be received are set to be those to be received from, the reception sensitivity may unnecessarily be degraded and the confidence of the transmission of information may unnecessarily be degraded. The cloud server 103 refrains from supplying the identification information of the transmitting apparatuses 101 from which the base station 102 is not likely to receive the wireless signals as above and the base station 102 can thereby exclude the transmitting apparatuses 101 from those to be received from and, in this case, any degradation of the reception sensitivity can be suppressed and more reliable transmission of information can be realized.

Moreover, the cloud server 103 obtains reception information obtained by receiving the wireless signal from the receiving apparatus 112 of the base station 102. On the basis of this reception information, the cloud server 103 manages, for example, the history of the transmission and the reception of information between the transmitting apparatus 101 and the receiving apparatus 112 (such as, for example, when the receiving apparatus 112 of which base station 102 receives a wireless signal transmitted from which transmitting apparatus 101, and the like). The cloud server 103 selects the transmitting apparatus 101 whose identification information is to be supplied to the base station 102, on the basis of this history, and supplies (a list of the pieces of) identification information (a list of expected IDs (LEID)) to the receiving apparatus 112 of the base station 102 in accordance with the selection result. Thus, the identification information of the transmitting apparatus 101 is supplied to the receiving apparatus 112 of the base station 102 on the basis of the past communication history as above, and the possibility for the receiving apparatus 112 of each of the base stations 102 to receive the wireless signal of each of the transmitting apparatuses 101 can thereby be accurately determined. Therefore, each of the base stations 102 can therefore realize more reliable transmission of the information.

Furthermore, the cloud server 103 can provide, for example, the position of the transmitting apparatus 101 (the elderly person 111) to the information processing terminal 104 on the basis of the reception information from the receiving apparatus 112.

In addition, the identification information of the transmitting apparatus 101 may be supplied from the cloud server 103 to the base station 102 in any form. For example, the cloud server 103 may supply the identification information of the transmitting apparatus 101 as a priority list to the base station 102. The priority list is information including a catalog of the identification information of the transmitting apparatus 101 from which the base station 102 having the priority list supplied thereto is highly likely to receive the wireless signal. For example, the cloud server 103 may produce the priority list dedicated to each of the base stations 102, for the base stations 102 and may supply the priority list to the base stations 102, and the base stations 102 each having the priority list supplied thereto may execute processing to receive the wireless signal from the transmitting apparatus 101 whose identification information is indicated in the priority list. Moreover, the priority degree (the priority) for reception by the base station 102 may be added to the identification information of the transmitting apparatus 101 supplied to this base station 102. For example, the priority degree of each piece of identification information may be included in the priority list. The base station 102 having the priority list supplied thereto may thereafter set the priority order of the signal reception, and the like on the basis of the priority degrees included in the priority list. The cloud server 103 not only can control the transmitting apparatuses 101 from which the base station 102 receives the wireless signals but also can control the priority order of the reception therefrom, by executing as above. For the priority degree, the communication distance can be determined from the difference between the position at which the base station 102 is located and that in the position information transmitted by the transmitting apparatus 101, and the priority degree can be varied corresponding to the communication distance.

<Exemplary Configuration of Transmitting Apparatus 101>

Figure 7:
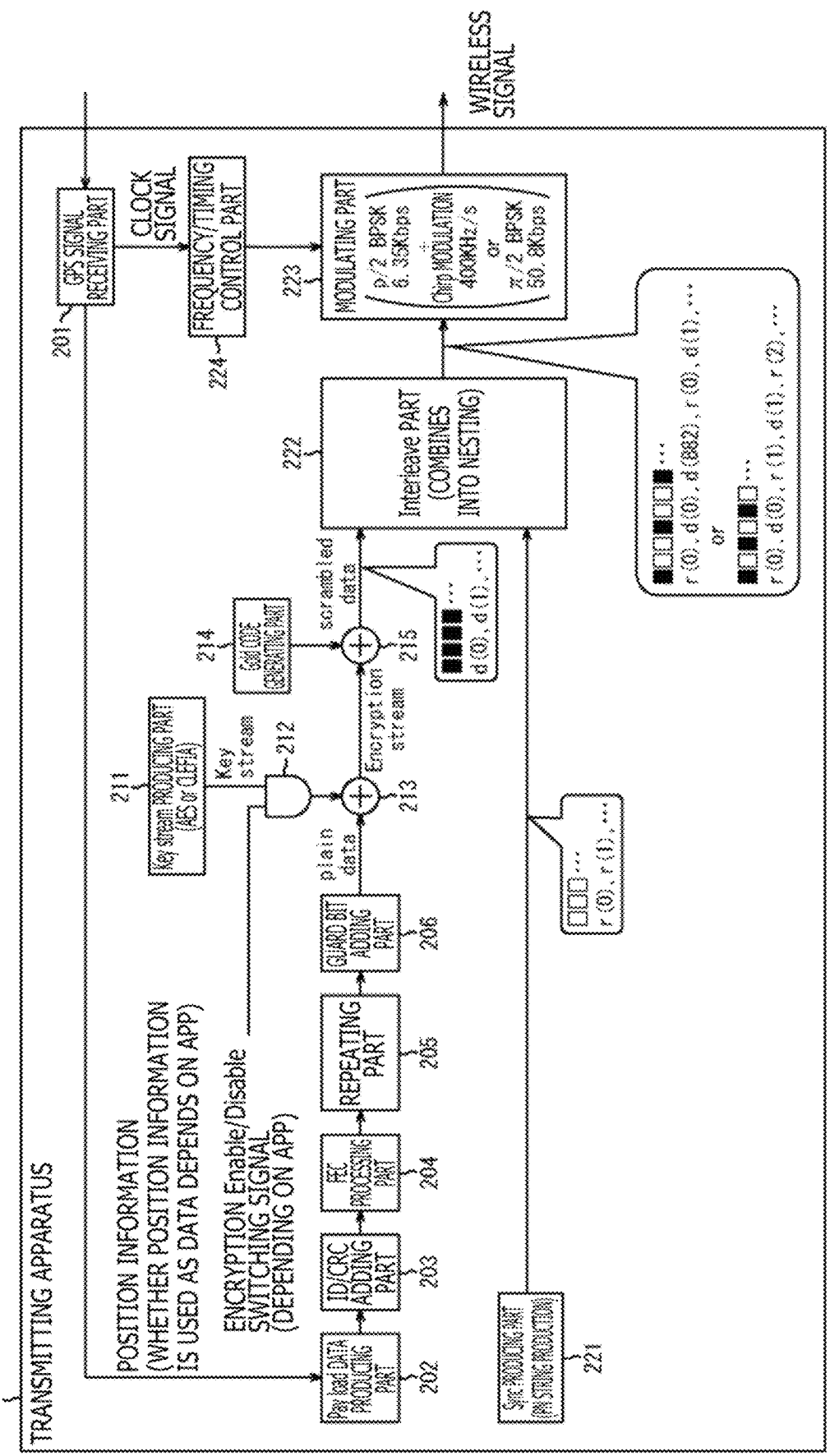
FIG. 7 is a block diagram depicting an exemplary configuration of a transmitting apparatus 101.

FIG. 7 is a block diagram depicting an exemplary configuration of the transmitting apparatus 101.

The transmitting apparatus 101 includes a GPS signal receiving part 201, a payload data producing part 202, an ID/CRC adding part 203, an FEC processing part 204, a repeating part 205, a guard bit adding part 206, a key stream producing part 211, an AND gate 212, an EXOR gate 213, a gold code generating part 214, an EXOR gate 215, a sync producing part 221, an interleave part 222, a modulating part 223, and a frequency/timing control part 224.

The GPS signal receiving part 201 receives a GPS signal, obtains a 1-PPS (pulse/second) signal and the current time of day (the GPS time of day) as a clock signal included in the GPS signal, and supplies these to the frequency/timing control part 224. Moreover, the GPS signal receiving part 201 obtains the position information (the degree of latitude, the degree of longitude, and the altitude) of the transmitting apparatus 101 from the GPS signal and supplies the position information to the payload data producing part 202 as sensor information obtained by sensing the position.

The payload data producing part 202 produces payload data to be the payload of the wireless signal from the position information as the sensor information from the GPS signal receiving part 201, and supplies the payload data to the ID/CRC adding part 203. In addition, the information to be the payload data is not limited to the position information or furthermore the sensor information. The information to be the payload data can be determined in accordance with, for example, the applications and the like to which the wireless system is applied. However, the new communication scheme is however one type of new communication scheme of the LPWA communication capable of transmitting information in a wide range from several tens to approximately 100 km with low electric power consumption, and the size of the information to be the payload data is desirably the size suitable for the LPWA communication.

The ID/CRC adding part 203 adds the ID (identification information) of the transmitting apparatus 101 and a cyclic redundancy check (CRC) to the payload data from the payload data producing part 202, thereby produces an FEC-target unit to be the target of a forward error correction (FEC) process, and supplies this unit to the FEC processing part 204. In addition, the FEC adding part 203 produces the CRC code for the payload data, or the payload data and the ID as the targets.

The FEC processing part (a coding part) 204 applies the FEC process to the FEC-target unit from the ID/CRC adding part 203 as the target, and supplies the FEC frame obtained as the result of the FEC process to the repeating part 205.

In other words, the FEC processing part 204 executes error correction coding for the FEC-target unit as the FEC process for the FEC-target unit, and supplies an error correction code obtained by the error correction coding to the repeating part 205.

More specifically, the FEC processing part 204 executes, for example, LDPC coding for the FEC-target unit, and supplies an LDPC code obtained by the LDPC coding to the repeating part 205.

In addition, the error correction code is not limited to the LDPC code. For example, a convolution code, a turbo code, or the like can be employed as the error correction code.

The repeating part 205 produces a repetition unit that has the LDPC code from the FEC processing part 204 repeatedly arranged therein, and supplies this repetition unit to the guard bit adding part 206.

The guard bit adding part 206 adds (inserts) the guard bit to (into) the repetition unit from the repeating part 205, and supplies this repetition unit to the EXOR gate 213.

The key stream producing part 211 produces a key stream to be used in the encrypting, and supplies this key stream to the AND gate 212.

To the AND gate 212, the key stream is supplied from the key stream producing part 211 and, in addition, a switching signal for switching valid/invalid of encryption by the EXOR gate 213 is supplied.

The switching signal is, for example, a signal that takes logical "1" (such as, for example, a high level) in the case where the encryption is set to be valid, and that takes logical "0" (such as, for example, a low level) in the case where the encryption is set to be invalid. The switching signal can be set in accordance with, for example, an application. The switching signal can be set such that encryption of the whole or a portion of the repetition unit supplied from the guard bit adding part 206 to the EXOR gate 213 is valid. Moreover, the switching signal can be set such that the encryption of the whole of the repetition unit supplied from the guard bit adding part 206 to the EXOR gate 213 is invalid.

The AND gate 212 computes the logical product of the switching signal and the key stream from the key stream producing part 211, and supplies this logical product to the EXOR gate 213. The key stream is thereby supplied from the AND gate 212 to the EXOR gate 213 for only the time period during which the switching signal indicates that the encryption is valid.

The EXOR gate 213 computes the exclusive logical sum of the repetition unit from the guard bit adding part 206 and the key stream from the AND gate 212 and thereby encrypts the repetition unit using a stream encryption (a scheme). The EXOR gate 213 supplies the repetition unit after the encryption to the EXOR gate 215.

Concerning the above, in the EXOR gate 213, the encryption is executed in the time period during which the key stream is supplied from the AND gate 212, of the repetition unit, that is, the time period during which the switching signal takes the logical "1." In the EXOR gate 213, therefore, the whole or a portion of the repetition unit may be encrypted or the whole of the repetition unit may not be encrypted.

The gold code generating part 214 generates, for example, a cold code as a scrambled sequence of the size (the number of the bits) equal to that of the repetition unit from the EXOR gate 213 using, for example, two M-sequence generators, and supplies the cold code to the EXOR gate 215.

The EXOR gate 215 computes the exclusive logical sum of the repetition unit from the EXOR gate 213 and the scrambled sequence from the gold code generating part 214, thereby executes scrambling for the repetition unit, and supplies the result to the interleave part 222.

The sync producing part 221 produces, for example, a predetermined pseudo noise (PN) sequence such as an M-sequence as a synchronization signal and supplies this synchronization signal to the interleave part 222. In addition, the synchronization signal produced by the sync producing part 221 is a signal known by the transmitting apparatus 101 and the receiving apparatus 112. The receiving apparatus 112 can execute synchronous detection of the wireless signal from the transmitting apparatus 101 and can robustly receive the wireless signal from the transmitting apparatus 101 by the fact that the synchronization signal is known by the transmitting apparatus 101 and the receiving apparatus 112. The initial value of the M-sequence may be any value only when the initial value is common to the transmission and reception. Moreover, the initial value of the M-sequence can be varied in accordance with the ID.

The interleave part 222 interleaves (multiplexes) a bit sequence d(0), d(1), and so on as the repetition unit from the EXOR gate 213 and a bit sequence r(0), r(1), and so on as the synchronization signal from the sync producing part 221 on each other, and supplies an interleave sequence r(0), d(0), r(1), d(1), and so on or r(0), d(0), d(832), r(1), d(1), and so on obtained by the interleaving to the modulating part 223.

The modulating part 223 executes modulation such as, for example, π/2 shift binary phase shift keying (π/2 shift BPSK) modulation, chirp modulation, or the like using the interleave sequence supplied from the interleave part 222, and transmits a wireless signal in, for example, the 920-MHz band as the modulated signal obtained by the modulation. In addition, the modulating part 223 transmits the wireless signal at the transmission timing and the transmission frequency in accordance with the control from the frequency/timing control part 224.

The frequency/timing control part 224 sets the transmission timing and the transmission frequency for the wireless signal to be transmitted by the modulating part 223 corresponding to the ID or the like of the transmitting apparatus 101, and controls the modulating part 223 to transmit the wireless signal at this transmission timing and this transmission frequency. The frequency/timing control part 224 executes the control of the modulating part 223 synchronizing with the clock signal from the GPS signal receiving part 201. In other words, the frequency/timing control part 224 recognizes, for example, whether or not the current timing is a grid timing (a grid time) that is a timing (determined in advance) known by the transmitting apparatus 101 and the receiving apparatus 112, in accordance with the clock signal from the GPS signal receiving part 201, and controls the modulating part 223 to start the transmission of the packet at the grid timing.

<Exemplary Configuration of Receiving Apparatus 112>

Figure 8:
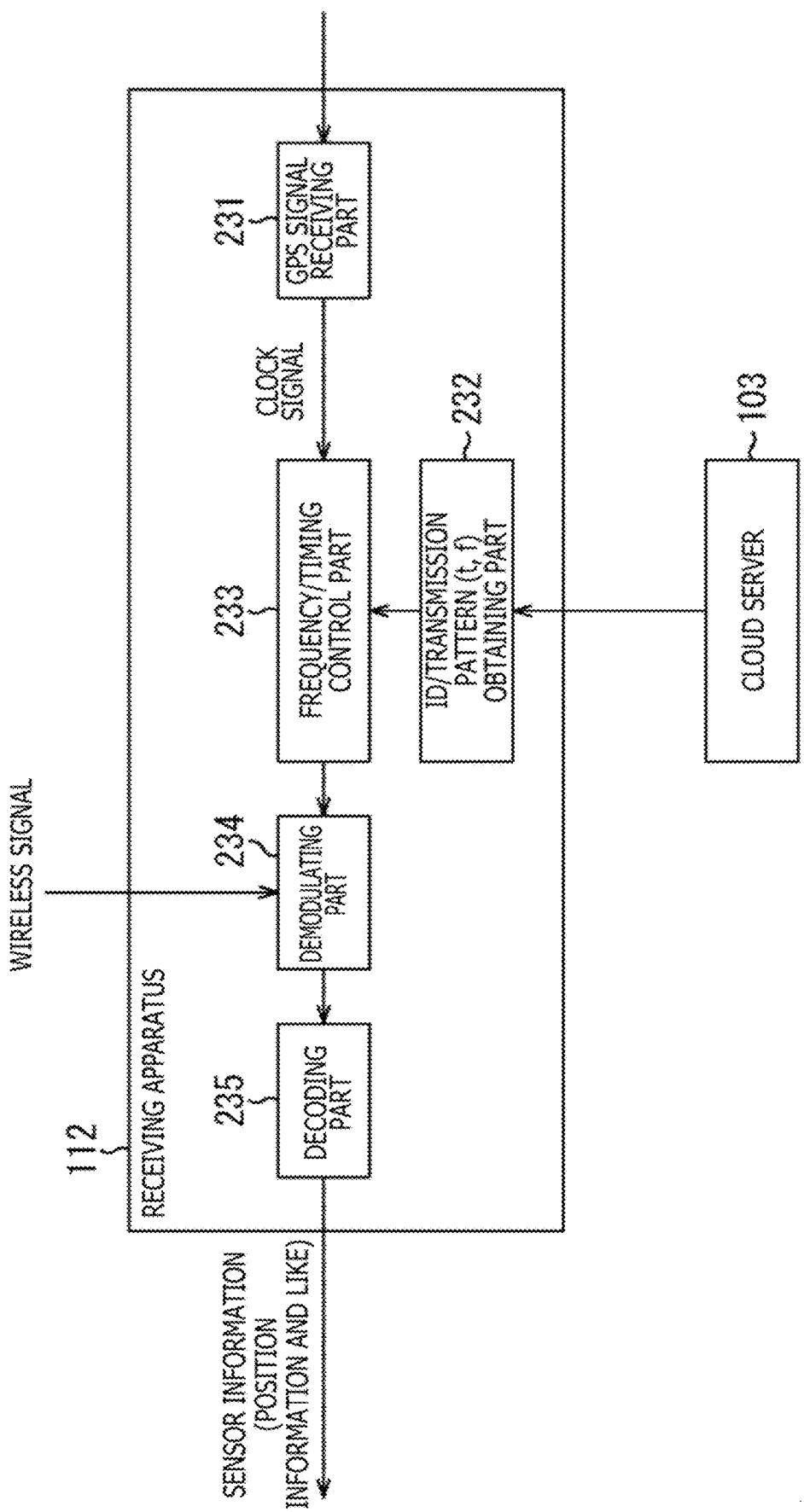
FIG. 8 is a block diagram depicting an exemplary configuration of a receiving apparatus 112.

FIG. 8 is a block diagram depicting an exemplary configuration of the receiving apparatus 112.

The receiving apparatus 112 includes a GPS signal receiving part 231, an ID/transmission pattern obtaining part 232, a frequency/timing control part 233, a demodulating part 234, and a decoding part 235.

The GPS signal receiving part 231 receives the GPS signal, obtains the 1-PPS signal or a GPS time of day included in the GPS signal, and supplies these as a clock signal to the frequency/timing control part 233.

The ID/transmission pattern obtaining part 232 obtains, for example, the ID of the transmitting apparatus 101 that the receiving apparatus 112 handles as the target for reception of the wireless signal, and the transmission pattern that is the pattern of the transmission timing and the transmission frequency, from the cloud server 103 and supplies these to the frequency/timing control part 233.

The frequency/timing control part 233 sets the reception timing and the reception frequency of the wireless signal at the demodulating part 234 in accordance with the transmission pattern from the ID/transmission pattern obtaining part 232, and controls the demodulating part 234 to receive the wireless signal at this reception timing and this reception frequency. Similar to the frequency/timing control part 224 in FIG. 7, the frequency/timing control part 233 executes the control of the demodulating part 234 synchronizing with the clock signal from the GPS signal receiving part 231.

Concerning the above, the transmission timing and the transmission frequency of the modulating part 223 and the reception timing and the reception frequency of the demodulating part 234 can be highly precisely matched with each other by executing both of the control of the transmission timing and the transmission frequency of the modulating part 223 (FIG. 7) and the control of the reception timing and the reception frequency of the demodulating part 234 synchronizing with the clock signal and the time of day information (the GPS time of day) obtained from the GPS signal as above.

The demodulating part 234 receives the wireless signal from the transmitting apparatus 101 at the reception timing and the reception frequency in accordance with the control by the frequency/timing control part 233, executes fast Fourier transform (FFT) or the like for the wireless signal, and thereby demodulates the wireless signal. The demodulating part 234 supplies a demodulated signal obtained by the demodulation of the wireless signal to the decoding part 235. In addition, in the demodulation by the decoding part 234, for example, synchronous detection is executed using the synchronization signal and combining described with reference to FIG. 2 is also executed.

The decoding part 235 decodes the LDPC code included in the decoded signal from the demodulating part 234, thereby executes error correction, and outputs the sensor information included in the payload data obtained as the result of the error correction. The sensor information is transmitted from the receiving apparatus 112 to the cloud server 103.

<Format of Data Handled by Transmitting Apparatus 101>

Figure 9:
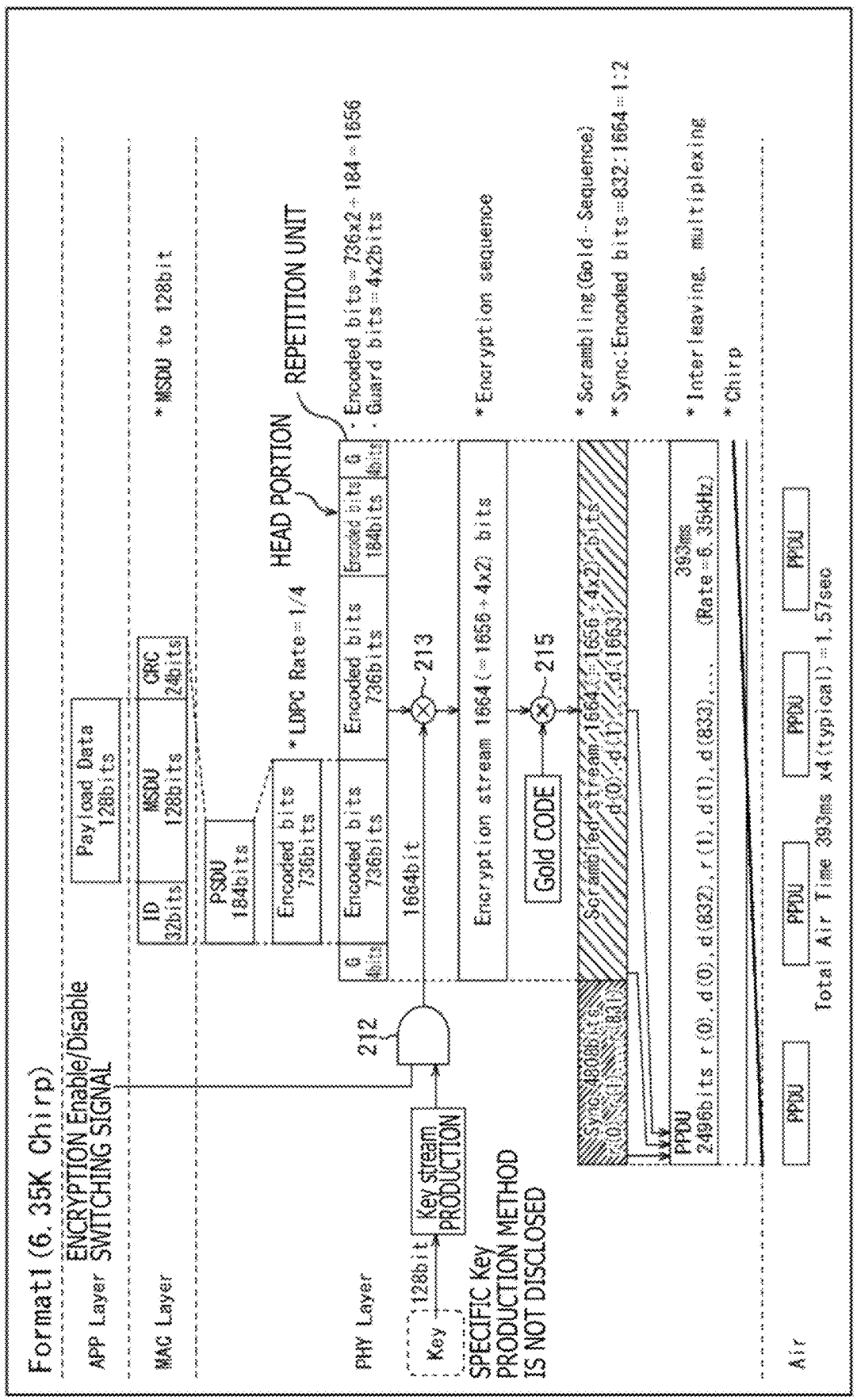
FIG. 9 is a diagram depicting an example of a first format of data handled by the transmitting apparatus 101.

FIG. 9 is a diagram depicting an example of a first format of data (the signal) handled by the transmitting apparatus 101.

Concerning the above, in the new communication scheme, for example, 6.35 kbps and 50.8 kbps are present as the modulation rates (the transmission rate) of the modulation executed by the modulating part 223.

FIG. 9 depicts a format of data in the case where the modulation rate is 6.35 kbps of 6.35 kbps and 50.8 kbps.

In the new communication scheme, for example, three types of mode are prepared that are MSDU Type-1, MSDU Type-2, and MSDU Type-3 as the setting modes of the payload data.

The payload data is a unit of 128 bits called media access control (MAC) service data unit (MSDU), for example, and 128 bits, 64 bits, and 1 bit are respectively used for transmission of actual data (user data) in the MSDU Type-1, MSDU Type-2, and MSDU Type-3.

In other words, in MSDU Type-1, the payload data producing part 202 configures the 128-bit MSDU using the actual data of 128 bits as it is (the sensor information and the like). In MSDU Type-2, the payload data producing part 202 configures the 128-bit MSDU by padding "0" of 64 bits into the actual data of 64 bits. In MSDU Type-3, the payload data producing part 202 configures the 128-bit MSDU by padding "0" of 127 bits into the actual data of 1 bit.

To the 128-bit MSDU, the ID of 32 bits of the transmitting apparatus 101 and the CRC code of 24 bits are added by the ID/CRC adding part 203, and a unit of 184 bits called "physical layer service data unit (PSDU)" as the FEC-target unit is thereby formed.

In the FEC processing part 204, the 184-bit PSDU is coded into, for example, an LDPC code whose code length is 736 bits and whose code rate is 1/4 and, as a result, a 736-bit (=184×4/1) LDPC code (encoding bits) is formed.

In the first format whose modulation rate is 6.35 kbps, the 736-bit LDPC code is repeated twice and 184 bits that are a portion of the 736-bit LDPC code are further repeated, and a repetition unit of 1,656 bits (=736 bits×2+184 bits) is thereby configured.

In other words, in the first format, the repetition unit is configured by repeating the 736-bit LDPC code twice to be arranged therein and further arranging therein the 184 bits that are a portion of the 736-bit LDPC code.

For example, 184 bits at the head of the 736-bit LDPC code can be employed as the 184 bits that are the portion of the 736-bit LDPC code arranged in the repetition unit. Moreover, the 184 bits that are the portion of the 736-bit LDPC code arranged in the repetition unit can be selected in accordance with, for example, a predetermined optimizing pattern.

To (into) the repetition unit, the guard bit adding part 206 adds (inserts) the guard bit.

In other words, the guard bits (G) of four bits are added to each of the head and the tail of the repetition unit.

The addition of the guard bits causes the 1,656-bit repetition unit to become a 1,664-bit (=1,656 bits+4 bits×2) repetition unit.

For example, "0" of 4 bits or the like can be employed as the 4-bit guard bits.

Concerning the above, the signal quality of the end portions of the repetition unit is degraded in the FFT for the repetition unit executed by the demodulating part 234 (FIG. 8) of the receiving apparatus 112. The guard bits are added to each of the head and the tail of the repetition unit as a countermeasure against the degradation of this signal quality.

For the repetition unit, the EXOR gate 213 computes the exclusive logical sum with the key stream, and the repetition unit thereby becomes an encryption stream.

Concerning the above, in the case where the setting mode of the payload data is MSDU Type-2 or MSDU Type-3, a portion of the 128-bit MSDU as the payload data is padded "0." In the MSDU Type-2, because "0" of 64 bits is padded into the actual data of 64 bits, a half of the 128-bit MSDU is "0." In other words, the half of the SMDU is meaningless information. In the MSDU Type-3, because "0" of 127 bits is padded into the actual data of 1 bit, most of the 128-bit MSDU is meaningless information.

The new communication scheme is a communication scheme that enables maximal effective use of the wireless energy sent to the communication path in the case where much meaningless information is included as above (in the case of MSDU Type-2 or MSDU Type-3). In other words, in the new communication scheme, the data produced as (a portion or the whole of) "0" of the padding can be excluded from the targets for encryption. In the case where "0" of the padding is excluded from the targets for the encryption, the switching signal to set the encryption executed in the time period of "0" of the padding in the repetition unit to be invalid is supplied to the AND gate 212. In accordance with the switching signal, the AND gate 212 supplies the key stream to the EXOR gate 213. The EXOR gate 213 thereby executes encryption of the repetition unit using the key stream from the AND gate 212 targeting only the time period during which the encryption is not invalid, that is, the encryption is valid in the repetition unit. For the portion whose encryption is invalid, no encryption is executed and "0" data of the padding is output as it is. It is known by the receiving apparatus 112 that the portion whose encryption is set to be invalid in this manner is data "0." Therefore, the demodulating part 234 of the receiving apparatus 112 handles the signal for the portion whose encryption is invalid as the synchronization signal and can improve the synchronization performance. Furthermore, the decoding part 235 decodes the portion whose encryption is invalid as the known data "0" and can thereby improve the error correction performance. In short, the performance of the receiving apparatus 112 is improved by setting the encryption to be partially invalid in the case where the payload is short. Even when the transmission aerial electric power is set to be, for example lower than that of the case where the encryption is not set to be partially invalid, due to the above performance improvement, the same level of communication performance can be realized.

Similar to the repetition unit before the encryption, the encryption stream is configured to have 1,664 bits.

The EXOR gate 215 computes the exclusive logical sum of the 1,664-bit encryption stream and the gold code as the scrambled sequence, and the 1,664-bit encryption stream is thereby scrambled to be a scrambled stream.

Similar to the encryption stream before being scrambled, the scrambled stream is a 1,664-bit bit sequence d(0), d(1), to d(1663).

For the first format whose modulation rate is 6.35 kbps, the sync producing part 221 produces, for example, a bit sequence r(0), r(1), to r(831) as a synchronization signal (Sync) of 832 bits.

For the first format whose modulation rate is 6.35 kbps, therefore, the ratios of the lengths of the synchronization signal and the scrambled stream are 832:1,664=1:2.

The bit sequence r(0), r(1), to r(831) as the 832-bit synchronization signal and the bit sequence d(0), d(1), to d(1,663) as the 1,664-bit scrambled stream are interleaved by the interleave part 222. As a result, a bit sequence r(0), d(0), d(832), r(1), d(1), d(833), and so on is produced as a 2,496-bit presentation protocol data unit (PPDU) that has the bits as the synchronization signal periodically inserted thereinto.

Concerning the above, the interleaving of the bit sequence r(0), r(1), to r(831) as the 832-bit synchronization signal and the bit sequence d(0), d(1), to d(1,663) as the 1,664-bit scrambled stream with each other is executed in accordance with the following "C" program, for example. In addition, "PPDU (n)" represents an (n+1)-th bit from the head of the 2,496-bit PPDU and (n % x) represents the remainder obtained by dividing n by x. A symbol "==" means determination as to whether or not the calculation results are equal. Moreover, the portion after the decimal point is truncated for calculation of division using "n" as the dividend (such as π/3).

```
for (n=0; n<2496; n++) {
    if ( (n%3) ==0)      PPDU(n) =r(n/3) ;
    if ( (n%3) ==1)      PPDU(n) =d(n/3) ;
    if ( (n%3) ==2)      PPDU(n) =d(n/3+1) ;
}
```

To the 2,496-bit PPDU, the modulating part 223 applies 6.35-kbps and π/2-shift BPSK modulation and further applies 400-kHz/s chirp modulation. The 2,496-bit PPDU becomes a wireless signal and is transmitted.

In the case where the 6.35-kbps and π/2-shift BPSK modulation is applied to the 2,496-bit PPDU, the transmission (sending) time period of the 2,496-bit PPDU is approximately 393.2 ms. The transmission of the 2,496-bit PPDU is therefore transmission taking 0.4 seconds or shorter, and satisfies the ARIB specification for the 920-MHz band.

In the chirp modulation, at the start of the transmission of the PPDU of the transmission time period of approximately 393.2 ms, a frequency shift of, for example, approximately −78.6 kHz is provided. In the chirp modulation of 400 kHz/s, because the frequency linearly varies at a variation rate of 400 kHz/s, the frequency shift at the end of the transmission of the PPDU of the transmission time period of approximately 393.2 ms is approximately +78.6 kHz.

For example, in the case where the frequency (the central frequency) of the carrier is 925 MHz, the signal frequency of the wireless signal is linearly varied by the chirp modulation in a section from 924.9214 MHz to 925.0786 MHz. Even in the case where a modulation rate of 6.35 kbps is used, the frequency use efficiency is improved by this chirp modulation and the communication becomes robust against any interference. Moreover, the computation amount necessary for the synchronous detection can be reduced due to the property of the chirp modulation.

For the first format, the transmitting apparatus 101 repeatedly executes transmission of the PPDU as a packet, for example, for four times. In this case, the time period necessary for these four PPDU transmission sessions is approximately 1.57 seconds (=393.2 ms×4).

Furthermore, in this embodiment, one type of LDPC code whose code length is 736 bits and whose code rate is 1/4 is prepared while, even in the case where the setting mode of the pay load data is any one of MSDU Type-1, MSDU Type-2, and MSDU Type-3, the 184-bit PSDU as the FEC-target unit is configured using the padding of "0," and the LDPC coding for the 184-bit PSDU is executed using the one type of LDPC code while, in addition, for example, an LDPC code for each of the setting modes can be prepared for each setting mode, and the LDPC coding of the actual data in each of the setting modes can be executed using the LDPC code for this setting mode without executing any padding of "0."

In the case where the LDPC code for each of the setting modes is prepared, however, the transmitting apparatus 101 needs to store therein the check matrix for the LDPC code for each of the setting modes and, moreover, in the LDPC coding, processing such as switching the check matrix for each setting mode is necessary. On the other hand, in the case where the transmitting apparatus 101 uses the one type of LDPC code whose code length N is 736 bits and whose code rate r is 1/4 is used, the check matrix for only one type of LDPC code needs to be stored for the LDPC code, and any switching of the check matrix is unnecessary. Alleviation of the load and finally reduction of the electric power consumption can therefore be facilitated.

Figure 10:
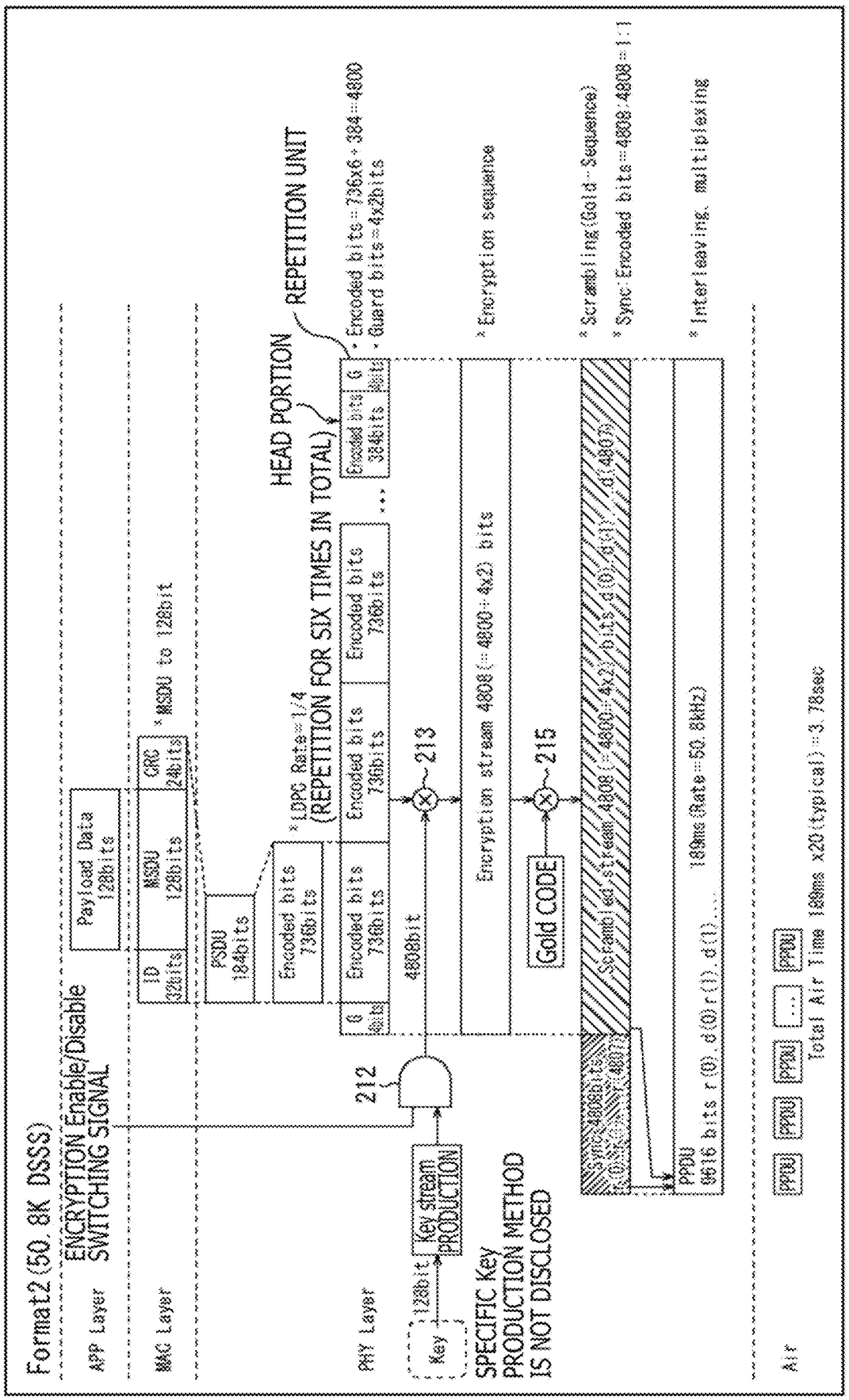
FIG. 10 is a diagram depicting an example of a second format of the data handled by the transmitting apparatus 101.

FIG. 10 is a diagram depicting an example of a second format of the data handled by the transmitting apparatus 101.

In other words, FIG. 10 depicts a format of data of the case where the modulation rate is 50.8 kbps of 6.35 kbps and 50.8 kbps.

In the second format, the MSDU as the payload data, the PSDU as the FEC-target unit, and the LDPC coding are similar to those of the case of the first format (FIG. 9) and will not again be described.

In the second format whose modulation rate is 50.8 kbps, the 736-bit LDPC code is repeated for six times, furthermore 384 bits that are a portion of the 736-bit LDPC code are repeated, and thereby a repetition unit of 4,800 bits (=736 bits×6+384 bits) is configured.

In other words, in the second format, the repetition unit is configured by repeating the 736-bit LDPC code for six times to be arranged therein and further arranging therein the 384 bits that are a portion of the 736-bit LDPC code.

For example, 384 bits at the head of the 736-bit LDPC code can be employed as the 384 bits that are the portion of the 736-bit LDPC code arranged in the repetition unit. Moreover, the 384 bits that are the portion of the 736-bit LDPC code arranged in the repetition unit can be selected in accordance with, for example, a predetermined optimizing pattern.

For the repetition unit, similarly to the case of the first format, a 4-bit guard bits (G) are added to each of the head and the tail thereof. The addition of the guard bits causes the 4,800-bit repetition unit to become a 4,808-bit (=4,800 bits+4 bits×2) repetition unit.

Thereafter, in the second format, similar to the case of the first format, the 4,808-bit repetition unit is encrypted to be an encryption stream, and is furthermore scrambled to be a scrambled stream.

In the second format, the scrambled stream becomes a 4,808-bit bit sequence d(0), d(1), to d(4807) whose size is equal to that of the repetition unit having the guard bits added thereto.

Moreover, for the second format, the sync producing part 221 produces a bit sequence r(0), r(1), to r(4087) as, for example, a synchronization signal (Sync) of 4,808 bits whose size is equal to that of the scrambled stream.

For the second format, therefore, the ratios of the lengths of the synchronization signal and the scrambled stream are 4,808:4,808=1:1.

The bit sequence r(0), r(1), to r(4087) as the 4,808-bit synchronization signal and the bit sequence d(0), d(1), to d(4,807) as the 4,808-bit scrambled stream are interleaved by the interleave part 222. As a result, a bit sequence r(0), d(0), r(1), d(1), and so on is produced as a 9,616-bit (=4,808 bits+4,808 bits) PPDU that has the bits as the synchronization signal periodically inserted thereinto.

Concerning the above, the interleaving of the bit sequence r(0), r(1), to r(4807) as the 4,808-bit synchronization signal and the bit sequence d(0), d(1), to d(4807) as the 4,808-bit scrambled stream is executed in accordance with, for example, the following program.

```
for (n=0; n<9616; n++) {
    if ( (n%2) ==0)     PPDU(n) =r(n/2) ;
    if ( (n%2) ==1)     PPDU(n) =d(n/2) ;
}
```

The 50.8-kbps and π/2-shift BPSK modulation is applied to the 9,616-bit PPDU by the modulating part 223 and this PPDU becomes a wireless signal to be transmitted.

In the case where the 50.8-kbps and π/2-shift BPSK modulation is applied to the 9,616-bit PPDU, the transmission time period of the 9,616-bit PPDU is approximately 189.4 ms. Therefore, the transmission time period of the 9,616-bit PPDU is therefore shorter by 0.2 seconds than that in the ARIB specification and the transmission can be executed repeatedly for plural times taking the transmission downtime to be short.

In the second format, the transmitting apparatus 101 repeats the transmission of the PPDU as a packet for, for example, 20 times. In this case, the time period necessary for the 20 transmission sessions of the PPDU is approximately 3.78 seconds (=189.4 ms×20). In the second format, the number of the repeated sessions of the transmission is greater than that of the first format and the information can thereby be more reliably transmitted even when any influence such as, for example, fading acts thereon. The selection of the first format or the second format can be executed in accordance with, for example, an application. For example, which one of the first and the second format is used can be determined on the basis of, the fading property required by the application, or the like.

<Exemplary Configuration of Key Stream Producing Part 211>

Figure 11:
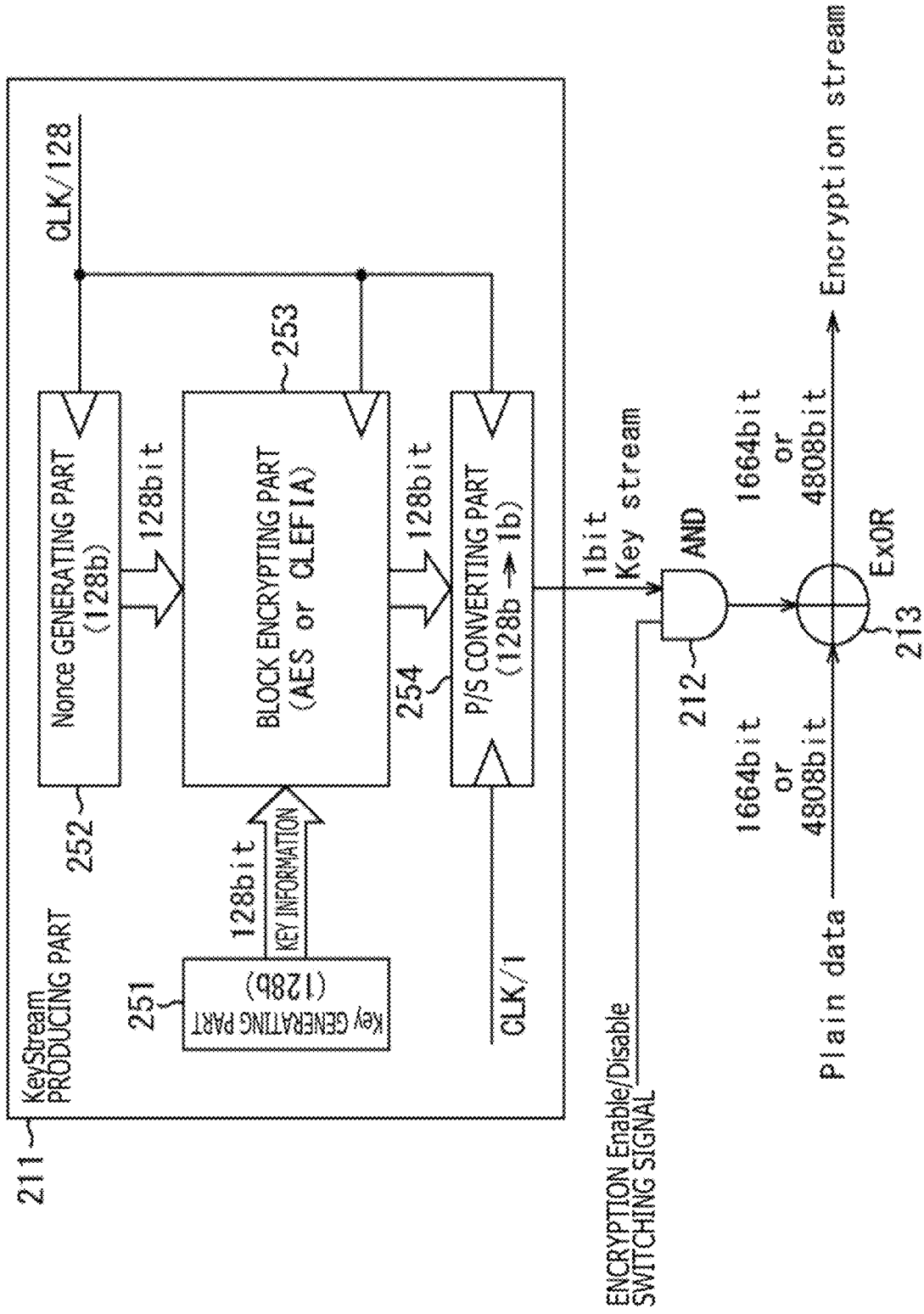
FIG. 11 is a block diagram depicting an exemplary configuration of a key stream producing part 211.

FIG. 11 is a block diagram depicting an exemplary configuration of the key stream producing part 211 in FIG. 7.

In FIG. 11, the key stream producing part 211 includes a key generating part 251, a Nonce generating part 252, a block encrypting part 253, and a P/S converting part 254.

The key stream producing part 211 produces the key stream used for the encryption. The key stream producing part 211 produces a key stream of 1,664 bits for the first formant and produces a key stream of 4,808 bits for the second formant.

The generating part 251 generates a key information of 128 bits. For the key generating part 251, the internal structure thereof is not disclosed to secure the safety of the cipher. For the key generating part 251, the configuration thereof may be any configuration only when its internal structure is not easily presumed.

The key generating part 251 can obtain the GPS time of day from, for example, the GPS signal receiving part 201 (FIG. 7), add zero data for the bit number to be 128 bits, and thereby produce (generate) the key information. The key generating part 251 supplies the produced key information to the block encrypting part 253.

The Nonce generating part 252 generates the number used once (Nonce) of 128 bits. It is expected for Nonce that the Nonce takes a different value at each timing of 128 frequency-divided bit clocks.

The Nonce generating part 252 can be configured by, for example, a 128-bit counter. In this case, the Nonce generating part 252 can initialize the counter to indicate, for example, a predetermined count value thereon before the start of the transmission of the wireless signal, thereafter increment the count value by one at each timing of 128 frequency-divided bit clocks, and thereby produce the Nonce. The Nonce generating part 252 supplies the produced Nonce to the block encrypting part 253.

The block encrypting part 253 generates a block cipher of 128 bits using the key information from the key generating part 251 and the Nonce from the Nonce generating part 252, and supplies the generated cipher to the P/S converting part 254.

For example, an advanced encryption standard (AES) code, a CLEFIA code, and the like are usable as the block cipher.

The P/S converting part 164 parallel to serial (P/S)-converts the block cipher in 128-bit units from the block encrypting part 253 for each one bit as a unit, thereby produces a serial key stream (in one-bit units), and supplies the key stream to the AND gate 212.

The P/S converting part 164 produces the 1,664-bit key stream for the first format, and produces the 4,808-bit key stream for the second format.

<Processing by Transmitting Apparatus 101>

Figure 12:
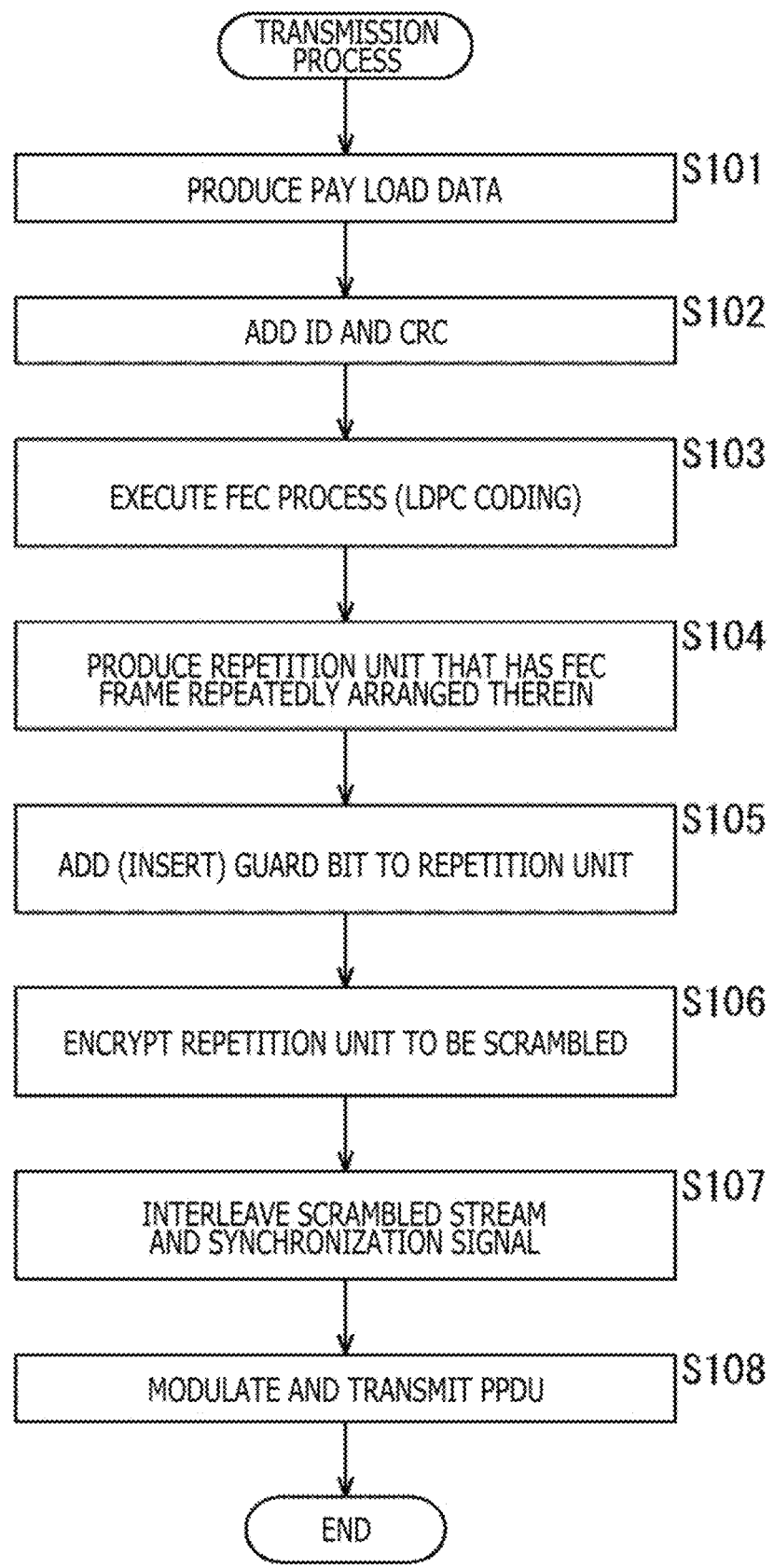
FIG. 12 is a flowchart explaining an example of a transmission process of the transmitting apparatus 101.

FIG. 12 is a flowchart explaining an example of a transmission process of the transmitting apparatus 101 in FIG. 7.

At step S101, the payload data producing part 202 produces the MSDU as the payload data and supplies the produced MSDU to the ID/CRC adding part 203, and the processing advances to step S102.

At step S102, the ID/CRC adding part 203 adds the ID and the CRC code of the transmitting apparatus 101 to the payload data from the payload data producing part 202, and thereby produces the PSDU as the FEC-target unit. The ID/CRC adding part 203 supplies the FEC-target unit to the FEC processing part 204 and the processing advances from step S102 to step S103.

At step S103, the FEC processing part 204 executes the LDPC coding for the FEC-target unit from the ID/CRC adding part 203, and supplies an FEC frame that is one code word of the LDPC code obtained by the LDPC coding to the repeating part 205, and the processing advances to step S104.

At step S104, the repeating part 205 produces the repetition unit that has the LDPC code from the FEC processing part 204 repeatedly arranged therein, and supplies the repetition unit to the guard bit adding part 206, and the processing advances to step S105.

At step S105, the guard bit adding part 206 adds the guard bits to the repetition unit from the repeating part 205 and supplies the resultant repetition unit to the EXOR gate 213, and the processing advances to step S106.

At step S106, the EXOR gate 213 encrypts the repetition unit from the guard bit adding part 206 and supplies the cipher stream obtained as the result to the EXOR gate 215. The EXOR gate 215 scrambles the cipher stream from the EXOR gate 213 and supplies the scrambled stream obtained as the result to the interleave part 222, and the processing advances from step S106 to step S107.

At step S107, the interleave part 222 interleaves the scrambled stream from the EXOR gate 213 and the synchronization signal from the sync producing part 221 with each other and supplies the PPDU obtained as the result of the interleaving to the modulating part 223, and the processing advances to step S108.

At step S108, the modulating part 223 executes the BPSK modulation or the chirp modulation using the PPDU supplied from the interleave part 222 and thereby produces a wireless signal in, for example, the 920-MHz band and transmits this wireless signal, and the processing comes to an end.

<Processing by Receiving Apparatus 112>

Figure 13:
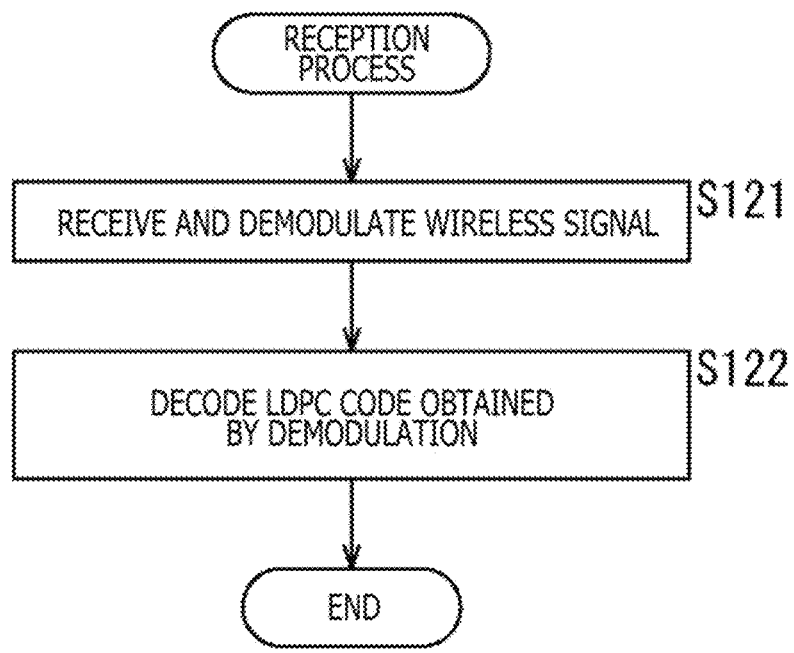
FIG. 13 is a flowchart explaining an example of a reception process of the receiving apparatus 112.

FIG. 13 is a flowchart explaining an example of a reception process of the receiving apparatus 112 in FIG. 8.

At step S121, the demodulating part 234 receives the wireless signal from the transmitting apparatus 101 and demodulates this wireless signal. The demodulating part 234 supplies the demodulated signal obtained by the demodulation of the wireless signal to the decoding part 235 and the processing advances from step S121 to step S122.

At step S122, the decoding part 235 decodes the LDPC code included in the decoded signal from the demodulating part 234 and outputs the sensor information included in the payload data obtained as the result of the decoding, and the processing comes to an end.

<LDPC Code>

Figure 14:
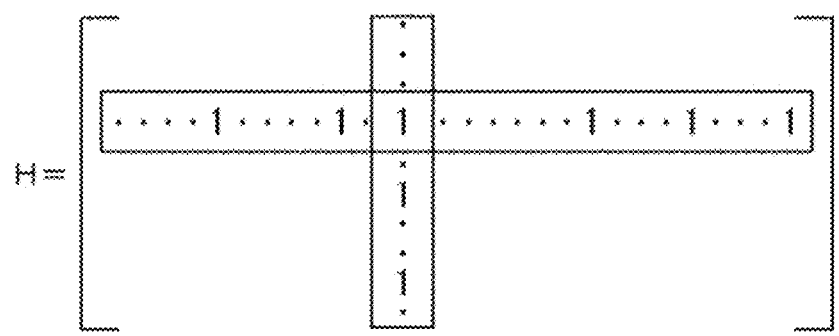
FIG. 14 is a diagram depicting an example of a check matrix H of an LDPC code.

FIG. 14 is a diagram depicting an example of a check matrix H of an LDPC code.

In addition, the LDPC code is a linear code and does not necessarily need to be two-dimensional while, in this example, description will be made assuming that the LDPC code is two-dimensional.

The LDPC code is most strongly characterized in that the check matrix (the parity check matrix) defining the LDPC code is sparse. Concerning this, a sparse matrix is a matrix whose number of the elements "1" of the matrix is very small (a matrix whose elements are mostly "0").

In the check matrix in FIG. 14, the weight of each column (the column weight) (the number of "1") (the weight) is "3" and the weight of each row (the row weight) is "6."

In the coding using the LDPC code (the LDPC coding), a produced matrix G is produced on the basis of, for example, the check matrix H and a code word (the LDPC code) is produced by multiplying a two-dimensional information bits by this produced matrix G.

More specifically, the coding apparatus executing the LDPC coding first calculates the produced matrix G for which an equation $GH^T=0$ holds with a transposed matrix $H^T$ of the check matrix H. Concerning this, in the case where the produced matrix G is a K×N matrix, the coding apparatus multiplies the produced matrix G by a bit string (a vector u) of the information bits including K bits and thereby produces a code word c (=uG) including N bits. The code word (the LDPC code) produced by the coding apparatus is received by the reception side through a predetermined communication path.

The decoding of the LDPC code is an algorism proposed by Gallager with the name of "probabilistic decoding," and can be executed using a message passing algorism by belief propagation on a what-is-called Tanner graph that includes variable nodes (each also referred to as "message node") and check nodes. Concerning this, the variable node and the check node will also hereinafter be each simply referred to as "node" when necessary.

Figures 15, 16:
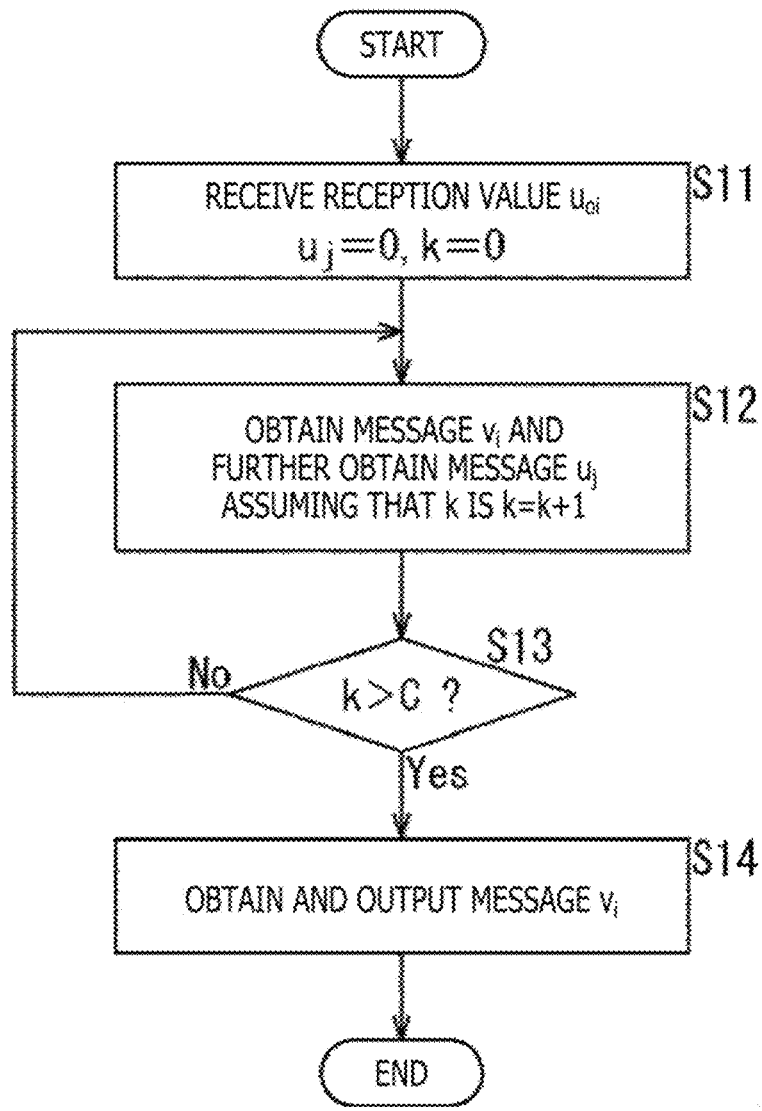
FIG. 15 is a flowchart depicting a procedure for decoding the LDPC code.
FIG. 16 is a diagram depicting an example of the check matrix H of a (3,6) LDPC code (whose code rate is 1/2 and whose code length is 12).

FIG. 15 is a flowchart depicting a procedure for decoding the LDPC code.

In addition, a real value representing the probability for the value of an i-th code bit of an LDPC code (one code word) received on the reception side to be "0," using a log likelihood ratio (reception LLR) will hereinafter be also referred to as "received value $u_{0i}$" when necessary. Moreover, a message output from a check node is denoted by "$u_j$," and a message output from a variable node is denoted by "$v_i$."

In the decoding of the LDPC code, as depicted in FIG. 15, at step S11, the LDPC code is first received, the message (check node message) $u_j$ is initialized to be "0," a variable k taking an integer as a counter for the repetition process is initialized to "0," and the procedure advances to step S12. At step S12, the message (the variable node message) $v_i$ is determined by executing computation represented by an equation (1) (variable node computation) on the basis of the received value $u_{0i}$ obtained by receiving the LDPC code and the message $u_j$ is further determined by executing computation represented by an equation (2) (check node computation) on the basis of this message $v_i$.

[Math. 1]

$$v_i = u_{0i} + \sum_{j=1}^{d_v-1} u_j \quad (1)$$

[Math. 2]

$$\tanh\left(\frac{u_j}{2}\right) = \prod_{i=1}^{d_c-1} \tanh\left(\frac{v_i}{2}\right) \quad (2)$$

Concerning the above, $d_v$ and $d_c$ in the equation (1) and the equation (2) are parameters each optionally selectable and respectively representing the number of "1" in the longitudinal direction (a column) and in the lateral direction (a row) of the check matrix H. For example, in the case of an LDPC code (a (3,6) LDPC code) for a check matrix H whose column weight is 3 and whose row weight is 6 as depicted in FIG. 14, $d_v$ is $d_v=3$ and $d_v$ is $d_c=6$.

In addition, in each of the variable node computation of the equation (1) and the check node computation of the equation (2), any message input from a branch (an edge) (a line connecting a variable node and a check node to each other) from which a message is to be output is not handled as a target for the computation, and the range of the computation is therefore 1 to $d_v-1$ or 1 to $d_c-1$. Moreover, the check node computation of the equation (2) is in practice executed by producing in advance a table of a function $R(v_1,v_2)$ represented by an equation (3) defined by one output for two inputs $v_1$ and $v_2$, and continuously (recursively) using this table as depicted in equation (4).

[Math. 3]

$$x=2 \tan h^{-1}\{\tan h(v_1/2)\tan h(v_2/2)\}=R(v_1,v_2) \quad (3)$$

[Math. 4]

$$u_j=R(v_1,R(v_2,R(v_3, \ldots R(v_{d_c-2},v_{d_c-1})))) \quad (4)$$

At step S12, the variable k is further incremented by "1" and the procedure advances to step S13. At step S13, it is determined whether or not the variable k is greater than a predetermined repetition decoding session number C. In the case where it is determined at step S13 that the variable k is not greater than C, the procedure returns to step S12 and the similar process steps are hereinafter repeated.

Moreover, in the case where it is determined at step S13 that the variable k is greater than C, the procedure advances to step S14, computation represented by an equation (5) is executed, thereby the message $v_1$ as the decoding result to be finally output is determined and is output, and the decoding process for the LDPC code comes to an end.

[Math. 5]

$$v_i = u_{0i} + \sum_{j=1}^{d_v} u_j \qquad (5)$$

Concerning the above, different from the variable node computation of the equation (1), the computation of the equation (5) is executed using the messages u from all the branches connected to the variable node.

FIG. 16 is a diagram depicting an example of the check matrix H of a (3,6) LDPC code (whose code rate is 1/2 and whose code length is 12).

In the check matrix H in FIG. 16, similar to that in FIG. 14, the weight of each column is 3 and the weight of each row is 6.

Figure 17:
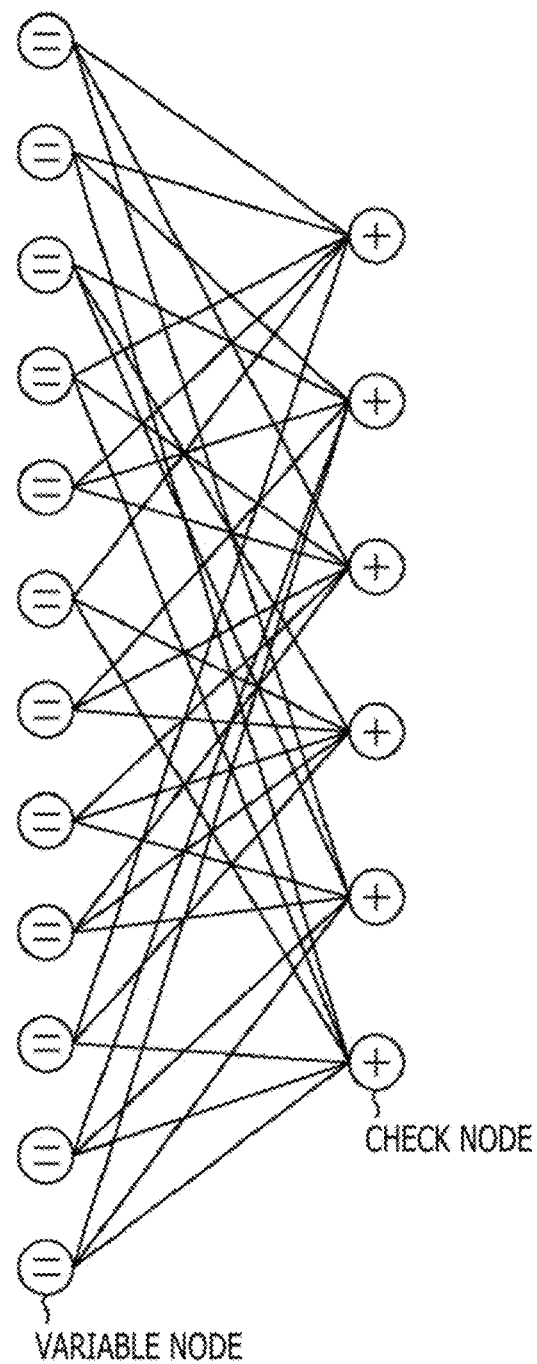
FIG. 17 is a diagram depicting a Tanner graph of the check matrix H.

FIG. 17 is a diagram depicting a Tanner graph of the check matrix H in FIG. 16.

Concerning the above, in FIG. 17, a node indicated by a plus "+" is the check node and a node indicated by an equal "=" is a variable node. The check node and the variable node respectively correspond to the row and the column of the check matrix H. A connecting line between the check node and the variable node is a branch (an edge) and corresponds to "1" of an element of the check matrix.

In other words, in the case where the element in the j-th row and the i-th column of the check matrix is "1," the i-th variable node from the top (a node of "=") and the j-th check node (a node of "+") from the top are connected to each other by a branch in FIG. 17. The branch indicates that a code bit corresponding to the variable node has a constraint condition corresponding to the check node.

In a sum product algorism that is a decoding method for the LDPC code, the variable node computation and the check node computation are repeatedly executed.

Figure 18:
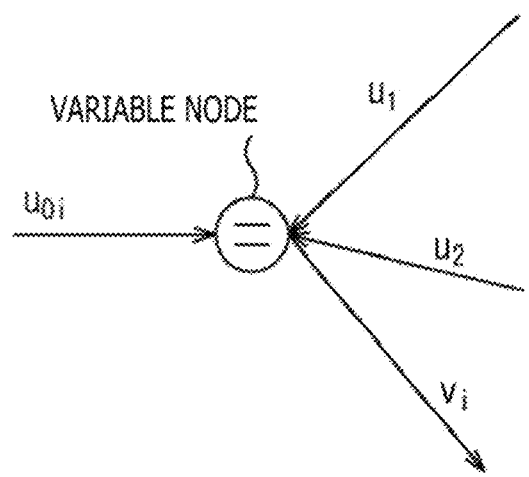
FIG. 18 is a diagram depicting variable node computation executed at a variable node.

FIG. 18 is a diagram depicting the variable node computation executed at a variable node.

At the variable node, the message $v_1$ corresponding to the branch for which calculation is to be started is determined by the variable node computation of the equation (1) that uses the messages $u_1$ and $u_2$ from the remaining branches connected to the variable node and the received value $u_{0i}$. The messages corresponding to the other branches can also be similarly determined.

Figure 19:
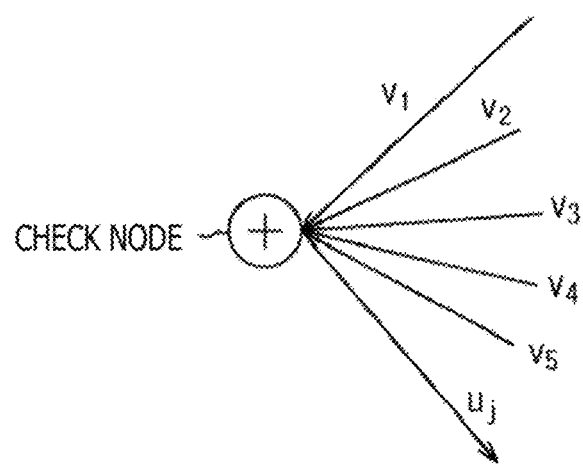
FIG. 19 is a diagram depicting check node computation executed at a check node.

FIG. 19 is a diagram depicting the check node computation executed at the check node.

Concerning the above, the check node computation of the equation (2) can be rewritten into an equation (6) using the relation of an equation a×b=exp{ln(|a|)+ln(|b|)}×sig n(a)× sig n(b). Concerning this, sig n(x) is 1 when x is x≥0 and −1 when x is x<0.

[Math. 6]

$$u_j = 2\tanh^{-1}\left(\prod_{i=1}^{d_c-1} \tanh\left(\frac{v_i}{2}\right)\right) \qquad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

When x is x≥0, defining a function φ(x) as an equation φ(x)=ln(tan h(x/2)), the equation φ$^{-1}$(x)=2 tan h$^{-1}$(e$^{-x}$) holds and the equation (6) can therefore be rearranged into an equation (7).

[Math. 5]

$$u_j = \phi^{-1}\left(\sum_{i=1}^{d_c-1} \phi(|v_i|)\right) \times \prod_{i=1}^{d_c-1} \text{sign}(v_i) \qquad (7)$$

At the check node, the check node computation of the equation (2) is executed in accordance with the equation (7).

In other words, at the check node, as in FIG. 19, the message $u_j$ corresponding to the branch for which calculation is to be started is determined by the check node computation of the equation (7) that uses the messages $v_1$, $v_2$, $v_3$, $v_4$, and $v_5$ from the remaining branches connected to the check node. The messages corresponding to the other branches can also be similarly determined.

In addition, the function φ(x) of equation (7) can be represented by an equation φ(x)=ln((e$^x$+1)/(e$^x$−1)), and φ(x)= φ$^{-1}$(x) holds when x is x>0. When the functions φ(x) and φ$^{-1}$(x) are implemented in hardware, the case where the functions are implemented using a look up table (LUT) is present while both of the functions are same LUTs.

Concerning the above, it is known that the LDPC code presents an extremely high performance in an additive white Gaussian noise (AWGN) communication path, and the LDPC code is employed in DVB-S.2, ATSC 3.0, and the like.

The LDPC code employed in DVB-S.2 and the like is an irregular repeat accumulate (IRA) code and (the whole of a portion of) a parity matrix in the check matrix of this LDPC code has a stepwise structure. The parity matrix and the stepwise structure will be described later.

Figure 20:
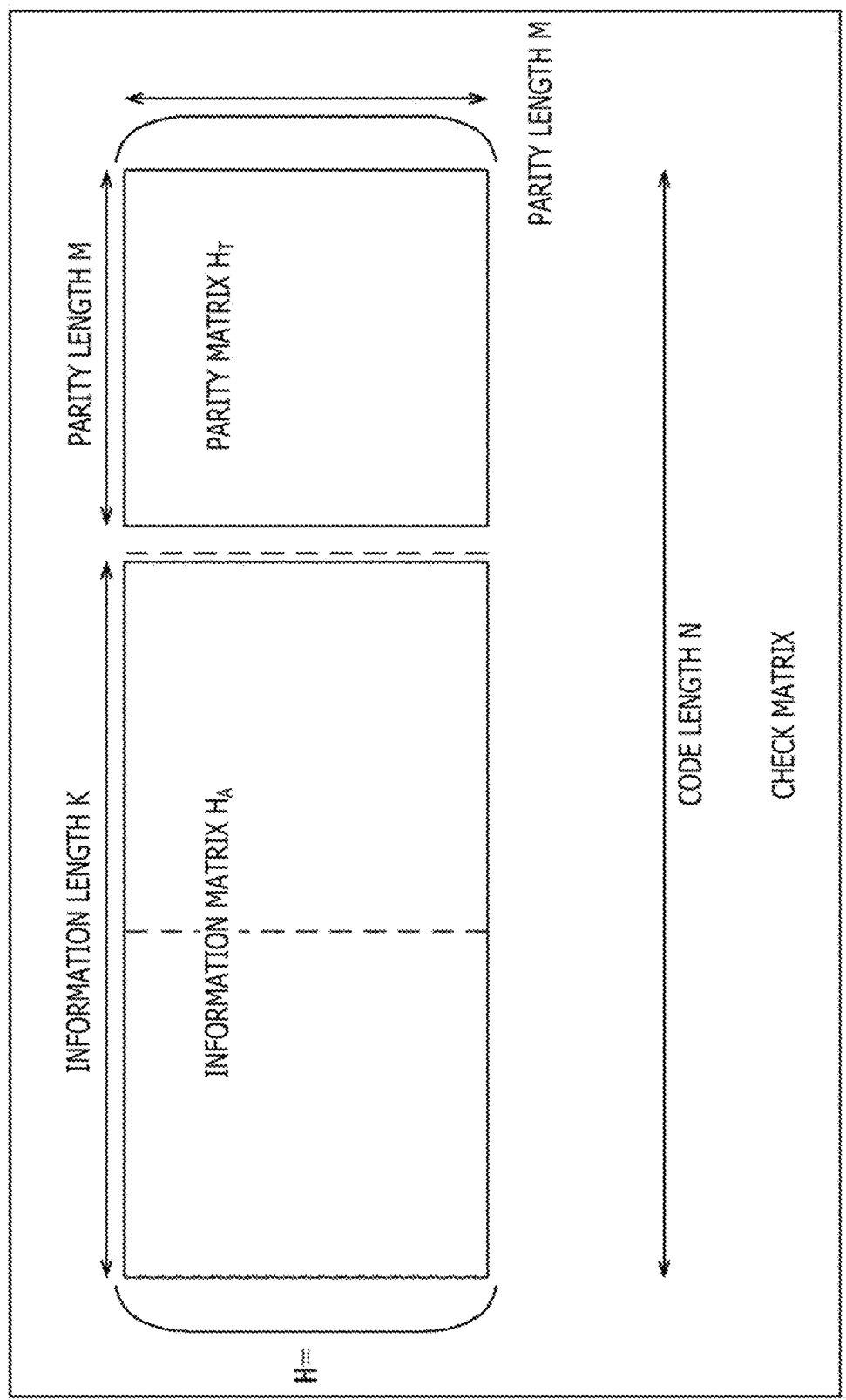
FIG. 20 is a diagram depicting an example of the structure of the check matrix H used in the LDPC coding.

FIG. 20 is a diagram depicting an example of the structure of the check matrix H used in the LDPC coding.

The check matrix H in FIG. 20 has a low-density generation matrix (LDGM) structure, and can be represented by an equation H=[H$_A$|H$_T$] using an information matrix (portion) H$_A$ corresponding to the information bits and a parity matrix (portion) H$_T$ corresponding to the parity bits, of the code bits of the LDPC code (a matrix that has the elements of the information matrix H$_A$ set to be its elements on the left side and the elements of the parity matrix H$_T$ set to be its elements on the right side).

Concerning the above, the number of the bits of the information bits and the number of the bits of the parity bits, of the code bits of the LDPC code of one code (one code word) will respectively be referred to as "information length K" and "parity length M," and the number of the bits of the code bits of the one LDPC code (one code word) will be referred to as "code length N (=K+M)."

The information length K and the parity length M for the LDPC code having a certain code length N are determined by the code rate. Moreover, the check matrix H is a matrix whose row×column is M×N (an M-row and N-column matrix). In addition, the information matrix H$_A$ is an M×K-matrix and the parity matrix H$_T$ is an M×M-matrix.

FIG. 21 is a diagram depicting an example of the parity matrix H$_T$ of the check matrix H.

For example, a parity matrix similar to the check matrix of the LDPC code provided in the standard such as DVB-S.2 and the like can be employed as the parity matrix $H_T$ of the check matrix H used in the LDPC coding in the new communication scheme.

As depicted in FIG. 21, the parity matrix $H_T$ of the check matrix H of the LDPC code provided in the standard of DVB-S.2 and the like is a matrix having a stepwise structure for its elements of "1" to be arranged in a what-is-called stepwise manner (a lower bidiagonal matrix). The row weight of the parity matrix $H_T$ for the first row is 1, and those for all the remaining rows are each 2. Moreover, the column weight thereof for the last one column is 1, and those for all the remaining columns are each 2.

As above, the LDPC code of the check matrix H whose parity matrix $H_T$ has the stepwise structure can easily be produced using the check matrix H thereof.

In other words, the LDPC code (one code word) is represented by a row vector c and a column vector obtained by transposing the row vector is denoted by "$c^T$." Moreover, the portion of the information bits of the row vector c that is the LDPC code is represented by "row vector A" and the portion of the parity bits is represented by "row vector T."

In this case, the row vector c can be represented by an equation c=[A|T] using the row vector A as the information bits and the row vector T as the parity bits (a row vector having the elements of the row matrix A set to be its elements on the left side and the elements of the row vector T set to be its elements on the right side).

The check matrix H, and the row vector c=[A|T] as the LDPC code need to satisfy an equation $Hc^T=0$, and the row vector T as the parity bits constituting the row vector c=[A|T] that satisfies the above equation $Hc^T=0$ can be sequentially (successively) determined by setting the elements in each row to be "0" sequentially from the elements in the first row of the column vector $Hc^T$ in the equation $Hc^T=0$ in the case where the parity matrix $H_T$ of the check matrix $H=[H_A|H_T]$ has the stepwise structure depicted in FIG. 21.

Relating to the above, the information matrix of the check matrix H of the LDPC code provided in the standard such as DVB-S.2 and the like has a (semi-) cyclic structure.

The cyclic structure refers to a structure in which a certain column matches with a column obtained by cyclically shifting another column and includes, for example, a structure in which, for each P columns, the positions of "1" of each row of the P columns is shifted to a position obtained by cyclically shifting the first column of the P columns in the column direction by a predetermined value such as a value proportional to the value q obtained by dividing the parity length M, or the like. The P columns in the cyclic structure will be referred to as "parallel factor" when necessary.

The LDPC codes provided in DVB-S.2 includes two types of LDPC code that are the ones whose code lengths N are 64,800 bits and 16,200 bits and, for each of both of the two types of LDPC code, the parallel factor is specified to be 360 that is one of the divisors of the parity length M except 1 and M.

Moreover, the parity length M is set to be a value other than the prime numbers, represented by an equation M=q×P=q×360 using a value q that differs depending on the code rate. Similar to the parallel factor P, the value q is therefore also another one of the divisors except 1 and M, of the divisors of the parity length M, and is obtained by dividing the parity length M by the parallel factor P (the product of P and q that are divisors of the parity length M is the parity length M).

Like the check matrix of the LDPC code provided in DVB-S.2, the check matrix whose information matrix has the cyclic structure is represented by a check matrix initial value table described below, and the number of the positions of "1" to be stored is thereby reduced to $1/P^2$ compared to the case where the positions of "1" of the check matrix whose positions of "1" is random are stored.

For the LDPC code, therefore, the information amount relating to the check matrix becomes small by employing the check matrix whose information matrix has the cyclic structure, the storage capacity can therefore be saved, and downsizing and cost reduction of the apparatus can be facilitated.

<Check Matrix Initial Value Table>

Figure 22:
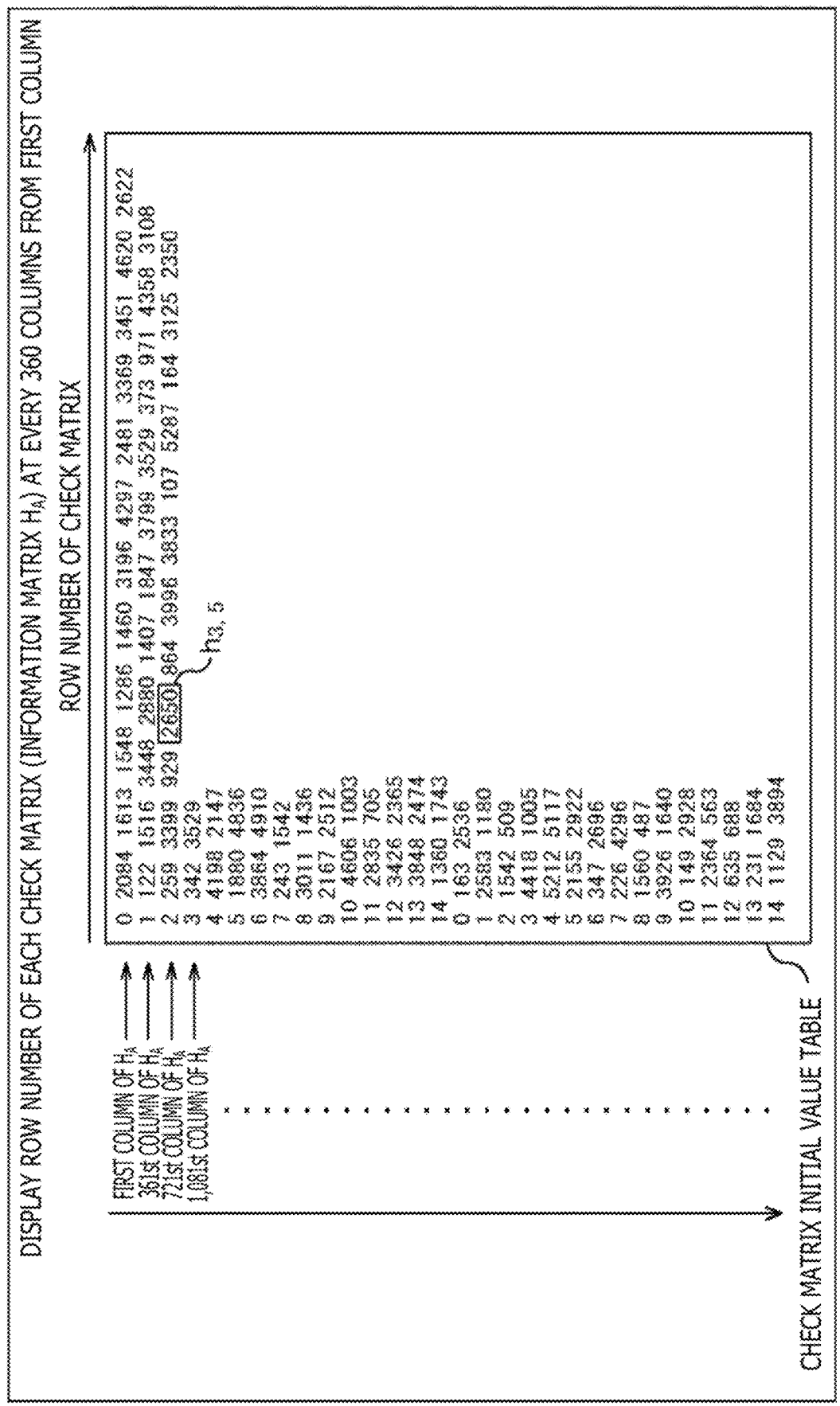
FIG. 22 is a diagram depicting an example of a check matrix initial value table.

FIG. 22 is a diagram depicting an example of the check matrix initial value table.

In other words, FIG. 22 depicts the check matrix initial value table provided in DVB-S.2 and the like.

The check matrix initial value table is, for example, a table that indicates, for each P (the parallel factor) columns, the positions of elements of "1" of the information matrix $H_A$ (FIG. 20) that correspond to the information length K in accordance with the code length N and the code rate r of the LDPC code (the LDPC code defined by the check matrix H) of the check matrix H.

In FIG. 20, the parallel factor P is 360 (columns).

In the check matrix initial value table, in the i-th row thereof, the row number of the elements of "1" in the (1+P×(i−1))-th column of the check matrix H (the row number determined by setting the row number of the first row of the check matrix H to be "0") are lines in the quantity corresponding to the number of the column weight retained by the (1+P×(i−1))-th column.

Concerning the above, it is assumed that the parity matrix $H_T$ (FIG. 20) corresponding to the parity length M of the check matrix H has the stepwise structure. In this case, the check matrix H can be determined when the information matrix $H_A$ (FIG. 20) corresponding to the information length K can be determined using the check matrix initial value table.

The number k+1 of the rows of the check matrix initial value table differs depending on the information length K.

A relation of an equation (8) holds between the information length K and the number k+1 of the rows of the check matrix initial value table.

$$K=(k+1)\times P \qquad (8)$$

In the check matrix initial value table in FIG. 22, the parallel factor P is 360 while 13 values are lined in the rows from the first row to the third row and 3 values are lined in the rows from the fourth row to the (k+1)-th row (in FIG. 22, the 30th row).

The column weight of the check matrix H obtained from the check matrix initial value table in FIG. 22 therefore is 13 for the columns from the first column to the (1+360×(3−1)−1)-th column and is 3 for the columns from the (1+360×(3−1))-th column to the K-th column.

The first row of the check matrix initial value table in FIG. 22 indicates 0, 2084, 1613, 1548, 1286, 1460, 3196, 4297, 2481, 3369, 3451, 4620, and 2622, and this represents that the elements whose row numbers are 0, 2084, 1613, 1548, 1286, 1460, 3196, 4297, 2481, 3369, 3451, 4620, and 2622 are each "1" in the first column of the check matrix H (and that the other elements are each "0").

Moreover, the second row of the check matrix initial value table in FIG. 22 indicates 1, 122, 1516, 3448, 2880, 1407, 1847, 3799, 3529, 373, 971, 4358, and 3108, and this represents that the elements in the rows whose row numbers are 1, 122, 1516, 3448, 2880, 1407, 1847, 3799, 3529, 373, 971, 4358, and 3108 are each "1" in the 361st (=1+360×(2−1)) column of the check matrix H.

The columns other than the (1+P×(i−1))-th column, that is, the columns from the (2+P×(i−1))-th column to the (P×i)-th column are the columns arranged by periodically cyclically shifting the elements of "1" of the (1+P×(i−1))-th column determined by the check matrix initial value table, downward (in the downward direction of the columns) in accordance with the parity length M.

In other words, according to the check matrix initial value table in FIG. 22 whose parallel factor P is 360, the (2+360×(i−1))-th column is a column arranged by cyclically shifting the (1+360×(i−1))-th column downward by M/360 (=q), and the next (3+360×(i−1))-th column is a column arranged by cyclically shifting the (1+360×(i−1))-th column downward by 2×M/360 (=2×q) (a column arranged by cyclically shifting the (2+360×(i−1))-th column downward by M/360 (=q)).

For the above, representing the value of the j-th column (j-th column from the left) of the i-th row (the i-th row from the top) of the check matrix initial value table by "$h_{i,j}$," and the row number of the element of the j-th "1" by "$H_{w-j}$," the row number $H_{w-j}$ of the element of "1" of the w-th column that is a column other than the (1+P×(i−1))-th column of the check matrix H can be determined using an equation (9).

$$H_{w-j}=\mathrm{mod}\{h_{i,j}+\mathrm{mod}((w-1),P)\times q,M\} \quad (9)$$

Concerning this, mod(x,y) means the remainder obtained by dividing x by y. Moreover, q is a value M/P obtained by dividing the parity length M by the parallel factor P (that is 360 in FIG. 22).

The row number of the element "1" of the (1+P×(i−1))-th column of the check matrix H can be identified using the check matrix initial value table. Moreover, the row number $H_{w-j}$ of the element of "1" of the w-th column that is a column other than the (1+P×(i−1))-th column of the check matrix H can be obtained in accordance with an equation (10). From the row number obtained as above, a check matrix H including the element of this row number set to be "1" can be produced.

In addition, for understandable description, it is assumed in this specification that the check matrix including the information matrix having the cyclic structure and the parity matrix having the stepwise structure is produced from the check matrix initial value table and, using this check matrix, the processes relating to the LDPC code are executed while, for implementation, the processes relating to the LDPC code can be executed directly using the check matrix initial value table. This is because the check matrix initial value table is information equivalent to the check matrix, for the check matrix including the information matrix having the cyclic structure and the parity matrix having the stepwise structure.

In the new communication scheme, for example, the LDPC code of the check matrix H including the information matrix having the cyclic structure and the parity matrix having the stepwise structure as above can be employed as the error correction code to be used in the FEC process.

In other words, the FEC processing part 204 (FIG. 7) of the transmitting apparatus 101 can execute the LDPC coding using the check matrix H including the information matrix having the cyclic structure and the parity matrix having the stepwise structure, and the decoding part 235 (FIG. 8) of the receiving apparatus 112 can execute the decoding of the LDPC code using the check matrix H.

In the new communication scheme, in the information transmission using the LDPC code, (the check matrix of) a high performance LDPC code is used to secure excellent communication quality.

The new high performance LDPC code used in the new communication scheme (hereinafter, also referred to as "new LDPC code") will be described below.

In the new communication scheme, as described with reference to FIG. 9, an LDPC code whose code length N is 736 bits and whose code rate r is 1/4 is employed. The information length K=N×r thereof is 184 bits because the code length N thereof is 736 bits and the code rate r thereof is 1/4.

FIG. 23 is a diagram depicting the check matrix initial value table indicating the check matrix of the new LDPC code whose code length N is 736 bits and whose code rate r is 1/4.

In the check matrix indicated in the check matrix initial value table in FIG. 23, "8" is employed as the parallel factor.

Moreover, in the check matrix indicated in the check matrix initial value table in FIG. 23, nine columns, one column, and 13 columns are present whose column weights are respectively 10, 9, and 3, and the row weight is 4 for all the rows.

The new LDPC code of the check matrix indicated in the check matrix initial value table in FIG. 23 (the LDPC code obtained from the check matrix) is a high performance LDPC code.

The high performance LDPC code is, for example, an LDPC code obtained from a proper check matrix, and the proper check matrix is a check matrix that satisfies a predetermined condition and that reduces the bit error rate (BER) and the frame error rate (FER) to be smaller when the LDPC code of the check matrix is transmitted at a low $E_s/N_0$ or a low $E_b/N_o$ (the ratio of the signal electric power to the noise electric power per one symbol or one bit).

The proper check matrix can be obtained by executing a simulation of, for example, measuring the BER obtained when the LDPC code obtained from various check matrixes each satisfying the predetermined condition is transmitted at a low $E_s/N_o$.

Examples of the predetermined condition to be satisfied by the proper check matrix H include, for example, excellent analysis result obtained using an analysis method for the performance of a code, that is called "density evolution," absence of any (short) loop of the element of "1" called "cycle 4" or "cycle 6," and the like.

When the elements of "1" are densely gathered like the cycle 4 or 6 in the information matrix, the decoding performance of the LDPC code is degraded. It is therefore desirable that the cycles 4 and 6 are absent as far as possible in the check matrix.

The minimal value of the length of a loop constituted by the elements of "1" (the loop length) in the check matrix is called "girth." The absence of the cycles 4 and 6 means that the girth is greater than 6.

In addition, the predetermined condition to be satisfied by the proper check matrix can properly be determined from the viewpoints of improvement of the decoding performance of the LDPC code, facilitation (simplification) of the decoding process of the LDPC code, and the like.

The new LDPC code of the check matrix indicated in the check matrix initial value table in FIG. 23 can be obtained by, for example, optimizing a degree spectrum of the LDPC code using an extrinsic information transfer (EXIT) chart analysis and selecting an LDPC code whose girth is greater than 6 and whose BER and FER in the AWGN communication path are excellent, from the LDPC codes in the degree spectrum after the optimization, and the like.

The new LDPC code is a high performance LDPC code and excellent communication quality can be secured in the information transmission that uses this new LDPC code.

The FEC processing part 204 of the transmitting apparatus 101 (FIG. 7) handles the 184-bit PSDU (FIG. 9 and FIG. 10) supplied from the ID/CRC adding part 203 as the information bits and sequentially computes the parity bits of the code word (the new LDPC code) satisfying an equation (10) using the check matrix H indicated in the check matrix initial value table in FIG. 23.

$$Hc^T=0 \qquad (10)$$

In the equation (10), c represents a row vector as the code word (the LDPC code) and $c^T$ represents transposition of the row vector c.

Concerning the above, in the case where the portion corresponding to the information bits of the row vector c as the LDPC code (one code word) is represented by the row vector A and the portion corresponding to the parity bits thereof is represented by the row vector T as above, the row vector c can be represented by an equation c=[A|T] using the row vector A as the information bits and the row vector T as the parity bits.

The check matrix H and the row vector c=[A|T] as the LDPC code need to satisfy the equation $Hc^T=0$, and the row vector T as the parity bits constituting the row vector c=[A|T] that satisfies the equation $Hc^T=0$ can sequentially be obtained by setting the elements of each row to be "0" sequentially from the elements of the first row of the column vector $Hc^T$ in the equation $Hc^T=0$ in the case where the parity matrix $H_T$ of the check matrix $H=[H_A|H_T]$ has the stepwise structure depicted in FIG. 21.

The FEC processing part 204 determines the parity bits T for the PSDU that is the 184-bit information bits A and outputs the code word c=[A|T] represented using the information bits A thereof and the parity bits T thereof, as the result of the LDPC coding for the information bits A.

On the other hand, the decoding part 235 of the receiving apparatus 112 (FIG. 8) executes the check node computation, the variable node computation, and the like described with reference to the equation (1) to the equation (7) using the check matrix indicated in the check matrix initial value table in FIG. 23, and executes the decoding for the LDPC code.

<Result of Simulation>

Figure 24:
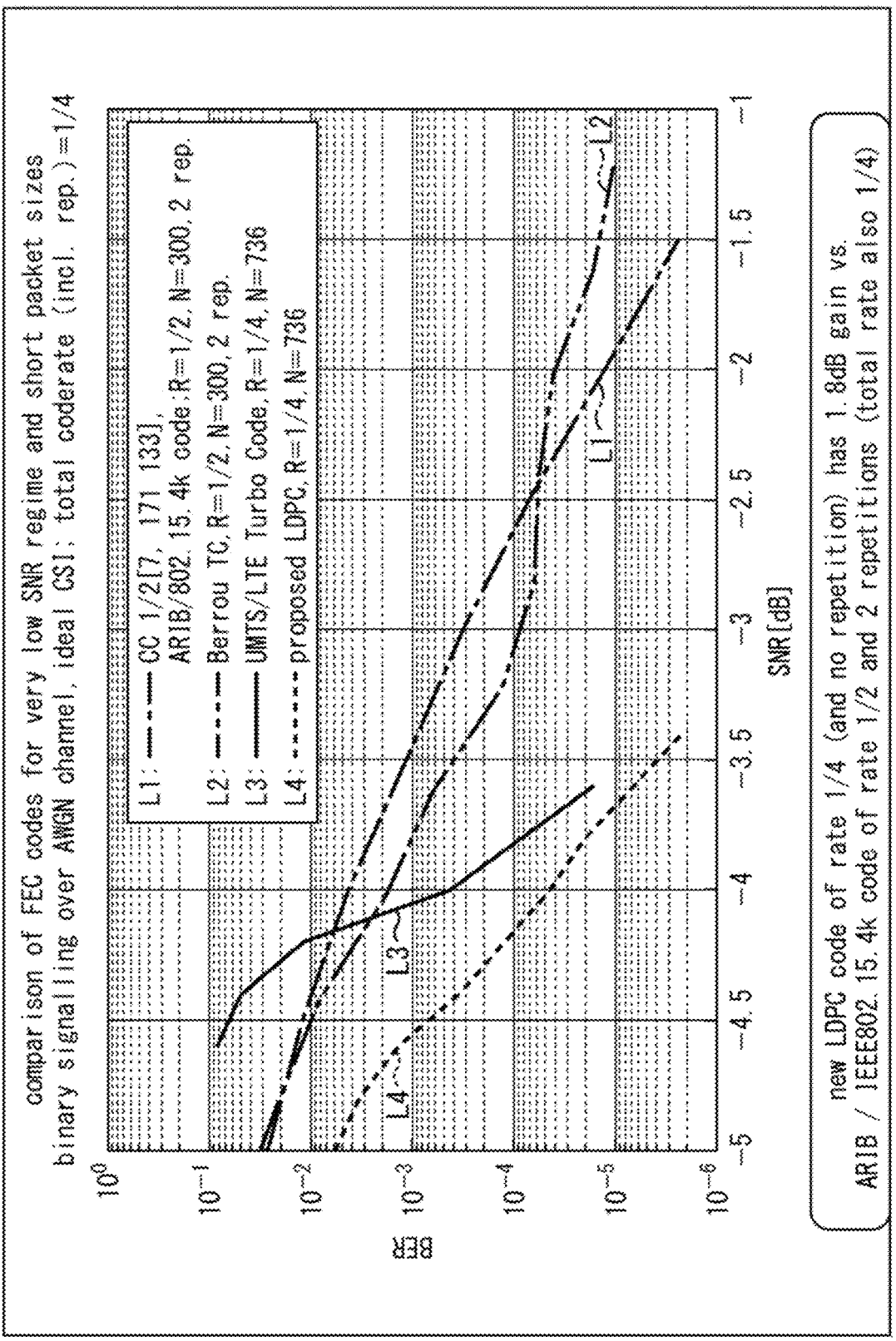
FIG. 24 is a diagram depicting a BER curve as a simulation result of a simulation of executing information transmission using the new LDPC code.

FIG. 24 is a diagram depicting a BER curve as a simulation result of a simulation of executing information transmission using the new LDPC code.

In FIG. 24, a BER curve L1 of the convolution code (CC), a BER curve L2 of the first turbo code (Berrou TC), and a BER curve L3 of the second turbo code (UMTS/LTE turbo code) are depicted in addition to a BER curve L4 of the new LDPC code.

In addition, both of the convolution code and the first turbo code are each a code whose code length N is 300 bits and whose code rate r is 1/2 while, in the simulation, the same code is transmitted twice (repeated). The convolution code and the first turbo code each substantially correspond to a code whose code and the like N are 600 bits and whose code rate r is 1/4. The second turbo code is the turbo code used in the LTE and, similar to the new LDPC code, is a code whose code length (N) is 736 bits and whose code rate (R) is 1/4.

In the simulation, an AWGN communication path was employed as the communication path for executing the information transmission.

From FIG. 24, it can be confirmed that, according to the new LDPC code whose code length is 736 bits, excellent BER/FER is realized compared to the convolution code (Berrou TC), and the first and the second turbo codes (Berrou TC and UMTS/LTE turbo code) each having a substantially equal code lengths (600 bits).

Concerning the above, it is generally recognized that the LDPC code tends to achieve its performance with a long code length such as approximately 10,000 bits or longer, and tends to avoid achieving its performance with a short code length such as 1,000 bits or shorter.

The new LDPC code however is a high performance code even though its code length is extremely short to be 736 bits.

<Description of Computer to which this Technique is Applied>

The above series of processes are executable by hardware or executable by software. In the case where the series of processes are executed by software, the program constituting the software is installed into a general-purpose computer, or the like.

Figure 25:
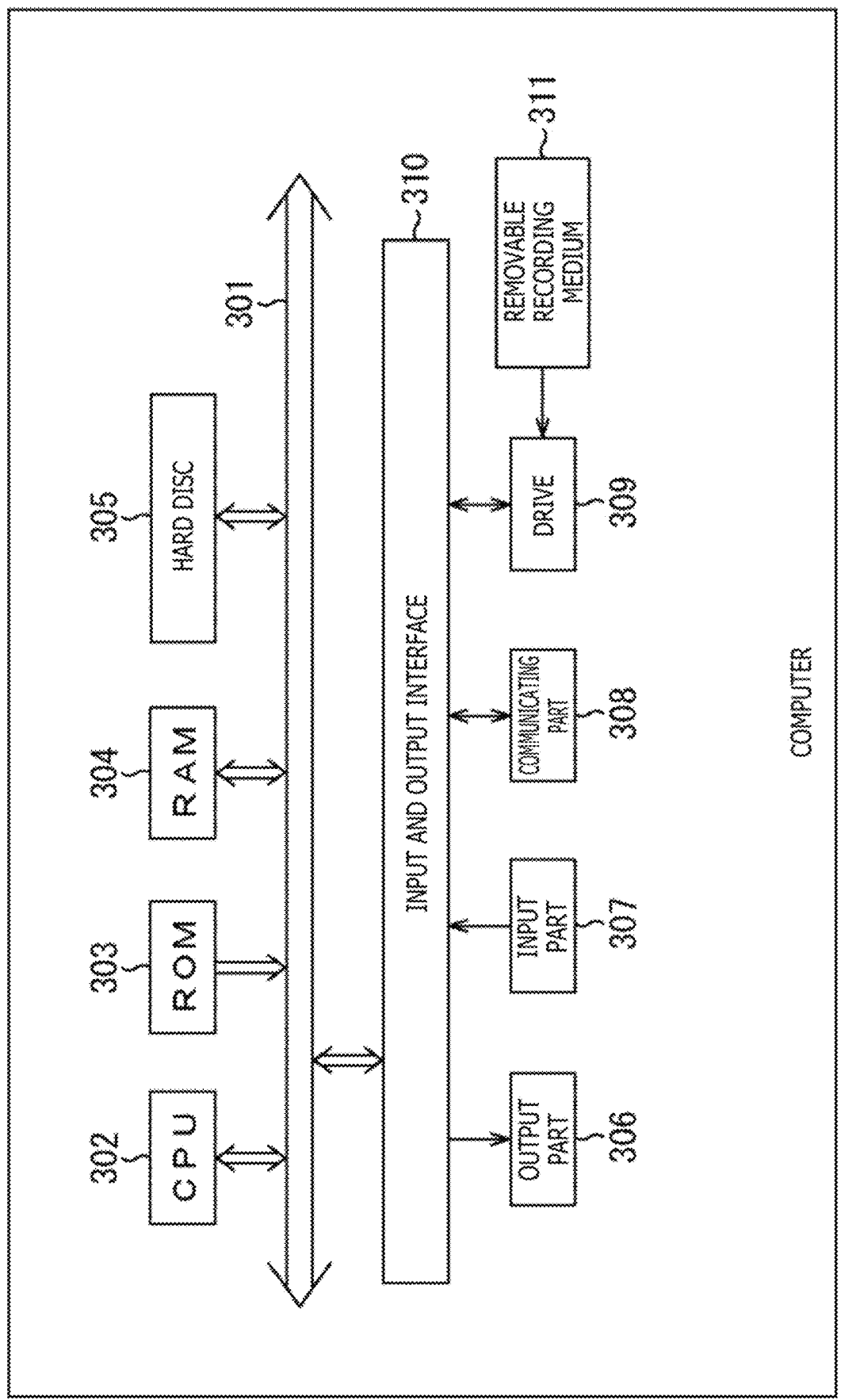
FIG. 25 is a block diagram depicting an exemplary configuration of an embodiment of a computer to which this technique is applied.

FIG. 25 is a block diagram depicting an exemplary configuration of an embodiment of a computer into which the program executing the above series of processes is installed.

The program can be recorded in advance on a hard disc 305 or a ROM 303 as a recording medium incorporated in the computer.

Otherwise, the program can be stored (recorded) in a removable recording medium 311. This removable recording medium 311 can be provided as what-is-called package software. Concerning this, examples of the removable recording medium 311 include, for example, a flexible disc, a compact disc read only memory (CD-ROM), a magneto optical (MO) disc, a digital versatile disc (DVD), a magnetic disc, a semiconductor memory, and the like.

The program can be installed from the above removable recording medium 311 into the computer and, in addition, can be downloaded into the computer through a communication network or a broadcasting network to be installed into the incorporated hard disc 305. In other words, for example, the program can be transferred wirelessly from a download site to the computer through an artificial satellite for digital satellite broadcasting or can be transferred by wire to the computer through a network such as a local area network (LAN) or the Internet.

The computer incorporates a central processing unit (CPU) 302 and, to the CPU 302, an input and output interface 310 is connected through a bus 301.

When an instruction is input by the fact that a user operates or the like an input part 307 through the input and output interface 310, the CPU 302 executes the program stored in a read only memory (ROM) 303 in accordance with the instruction. Otherwise, the CPU 302 loads the program stored in the hard disc 305 into a random access memory (RAM) 304 and executes the program.

The CPU 302 thereby executes the processes in accordance with the above flowcharts or the processes executed by the configurations in the block diagram. The CPU 302 thereafter, for example, when necessary, outputs the process results from an output part 306 through the input and output interface 310, transmits the process results from a communicating part 308, and furthermore causes the hard disc 305 to record therein the process results and the like.

In addition, the input part 307 includes a keyboard, a mouse, a microphone, and the like. Moreover, the output part 306 includes a liquid crystal display (LCD), a speaker, and the like.

Concerning the above, in this specification, the processes executed by the computer in accordance with the program do not necessarily need to be chronologically executed in accordance with the order described as the flowcharts. In other words, the processes executed by the computer in accordance with the program include processes executed in parallel to each other or each executed separately from each other (for example, parallel processing or processing by an object).

Moreover, the program may be a program to be processed by one computer (processor) or may be a program to be processed being distributed by plural computers. Furthermore, the program may be a program to be transferred to a faraway computer to be processed.

Furthermore, in this specification, the "system" means an aggregate of plural components (such as an apparatus, a module (a part), and the like) with no regard to whether or not all the plural components are in the same one housing. Therefore, both of plural apparatuses each accommodated in an individual housing and each connected to each other through a network, and one apparatus having therein plural modules accommodated in one housing, are each a system.

In addition, an embodiment of this technique is not limited to the above embodiment and various changes can be made thereto within the scope not departing from the gist of this technique.

For example, this technique can take the configuration of cloud computing that processes one function sharing the processing by plural apparatuses in cooperation therewith through a network.

Moreover, each of the steps described with reference to the above flowcharts can be executed by one apparatus and, in addition, can also be executed by plural apparatuses being shared thereby.

Furthermore, in the case where one step includes plural processes, the plural processes included in the one step can be executed by one apparatus and, in addition, can also be executed by plural apparatuses being shared thereby.

In addition, the CRC code is added to the MSDU and the CRC code executes the error detection in the first and the second format in this embodiment while, in addition, the error detection (correction) of the MSDU can be executed by, for example, the LDPC code. For example, assuming that the ID is 22 bits, 150 bits as the total of the 22-bit ID and the 128-bit MSDU are set to be the information bits and these 150-bit information bits can be coded by, for example, the LDPC code whose code rate is 1/4. In the case where the 150-bit information bits are coded by the LDPC code whose code rate is 1/4, the code length of the LDPC code obtained by this coding is 600 bits (=150×4/1). For example, the following table indicating the positions of the element of "1" of the information matrix for each 15 columns can be employed as the check matrix initial value table indicating the check matrix of the above LDPC code.

| 59 | 68 | 105 | 124 | 132 | 212 | 217 | 343 | 349 | 390 |
|---|---|---|---|---|---|---|---|---|---|
| 12 | 28 | 39 | 146 | 165 | 187 | 311 | 363 | 406 | 438 |
| 58 | 83 | 111 | 134 | 174 | 207 | 241 | 414 | 431 | 442 |
| 104 | 142 | 175 | 201 | 274 | 289 | 325 | 333 | 340 | 419 |
| 309 | 376 | 390 | | | | | | | |
| 125 | 318 | 386 | | | | | | | |
| 32 | 220 | 426 | | | | | | | |
| 151 | 188 | 230 | | | | | | | |
| 267 | 283 | 437 | | | | | | | |
| 17 | 413 | | | | | | | | |

The above check matrix initial value table indicates the positions of the element of "1" of the information matrix, and the parallel factor P is therefore 15.

Moreover, the effects described herein are absolutely exemplification and are not limited, and any other effects may be present.

REFERENCE SIGNS LIST

101 Transmitting apparatus, 102 Base station, 103 Cloud server, 104 Information processing terminal, 112 Receiving apparatus, 201 GPS signal receiving part, 202 Payload data producing part, 203 ID/CRC adding part, 204 FEC processing part, 205 Repeating part, 206 Guard bit adding part, 211 Key stream producing part, 212 AND gate, 213 EXOR gate, 214 Gold code generating part, 215 EXOR gate, 221 Sync producing part, 222 Interleave part, 223 Modulating part, 224 Frequency/timing control part, 231 GPS signal receiving part, 232 Frequency/timing control part, 233 ID/transmission pattern obtaining part, 234 Demodulating part, 235 Decoding part, 251 Key generating part, 252 Nonce generating part, 253 Block encrypting part, 254 P/S converting part, 301 Bus, 302 CPU, 303 ROM, 304 RAM, 305 Hard disc, 306 Output part, 307 Input part, 308 Communicating part, 309 Drive, 310 Input and output interface, 311 Removable recording medium

The invention claimed is:

1. A transmitting apparatus comprising:
   an encoder that executes low density parity check (LDPC) coding of data using a check matrix of an LDPC code whose code length is 736 bits and whose code rate is 1/4;
   a modulator that modulates the encoded data, obtained from the LDPC coding, repeatedly arranged therein; and
   a transmitter that wirelessly transmits the modulated encoded data to a receiving apparatus for decoding,
   wherein
   the LDPC code includes information bits and parity bits,
   the check matrix includes an information matrix portion corresponding to the information bits and a parity matrix portion corresponding to the parity bits,
   the parity matrix portion has a stepwise structure,
   the information matrix portion is indicated by a check matrix initial value table, and
   the check matrix initial value table is a table that indicates positions of elements of "1" of the information matrix portion for each eight columns and is

| 1 | 7 | 90 | 172 | 209 | 359 | 401 | 420 | 483 | 487 |
|---|---|---|---|---|---|---|---|---|---|
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |

-continued

| | | |
|---|---|---|
| 8 | 246 | 482 |
| 15 | 72 | 91 |
| 43 | 69 | 390 |
| 127 | 186 | 506 |
| 55 | 81 | 412. |

2. A transmission method performed by a wireless communication device that includes an encoder and a modulator, the method comprising:
  performing low density parity check (LDPC) coding of data using a check matrix of an LDPC code whose code length is 736 bits and whose code rate is 1/4; and
  modulating the encoded data, obtained from the LDPC coding, repeatedly arranged therein; and
  wirelessly transmitting the modulated encoded data to a receiving apparatus for decoding, wherein
  the LDPC code includes information bits and parity bits,
  the check matrix includes an information matrix portion corresponding to the information bits and a parity matrix portion corresponding to the parity bits,
  the parity matrix portion has a stepwise structure,
  the information matrix portion is indicated by a check matrix initial value table, and
  the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 507 | 380 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412. | | | | | | | |

3. A non-transitory computer readable program product containing instructions to cause a wireless communication device to perform a method, the method comprising:
  performing low density parity check (LDPC) coding of data using a check matrix of an LDPC code whose code length is 736 bits and whose code rate is 1/4;
  modulating the encoded data, obtained from the LDPC coding, repeatedly arranged therein; and
  wirelessly transmitting the modulated encoded data to a receiving apparatus for decoding, wherein
  the LDPC code includes information bits and parity bits,
  the check matrix includes an information matrix portion corresponding to the information bits and a parity matrix portion corresponding to the parity bits,
  the parity matrix portion has a stepwise structure,
  the information matrix portion is indicated by a check matrix initial value table, and
  the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412. | | | | | | | |

4. A wireless receiving apparatus comprising:
  a receiver configured to receive a signal transmitted from a transmitting apparatus;
  a demodulator that demodulates the signal, wherein the transmitting apparatus includes:
    an encoder that executes low density parity check (LDPC) coding of data using a check matrix of an LDPC code whose code length is 736 bits and whose code rate is 1/4; and
    a modulator that modulates the encoded data, obtained from the LDPC coding, repeatedly arranged therein; and
    a transmitter that transmits the modulated encoded data, wherein
  the LDPC code includes information bits and parity bits,
  the check matrix includes an information matrix portion corresponding to the information bits and a parity matrix portion corresponding to the parity bits,
  the parity matrix portion has a stepwise structure,
  the information matrix portion is indicated by a check matrix initial value table, and
  the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |

-continued

| | | |
|---|---|---|
| 15 | 72 | 91 |
| 43 | 69 | 390 |
| 127 | 186 | 506 |
| 55 | 81 | 412; | and a decoder that decodes the LDPC code, obtained from the demodulator, using the check matrix.

5. A reception method by a wireless communication device, the method comprising:

receiving and demodulating a signal transmitted from a transmitting apparatus that includes:

an encoder that executes low density parity check (LDPC) coding of data using a check matrix of an LDPC code whose code length is 736 bits and whose code rate is 1/4;

a modulator that modulates the encoded data, obtained from the LDPC coding, repeatedly arranged therein; and a transmitter that transmits the modulated encoded data, wherein the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 281 | 486 | | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412; | | | | | | | | and decoding the LDPC code, obtained by demodulating the signal, using the check matrix.

6. A non-transitory computer readable program product containing instructions to cause a wireless communication device to perform a method, the method comprising:

receiving and demodulating a signal transmitted from a transmitting apparatus that includes:

an encoder that executes low density parity check (LDPC) coding of data using a check matrix of an LDPC code whose code length is 736 bits and whose code rate is 1/4;

a modulator that modulates the encoded data, obtained from the LDPC coding, repeatedly arranged therein; and a transmitter that transmits the modulated encoded data, wherein the LDPC code includes information bits and parity bits, the check matrix includes an information matrix portion corresponding to the information bits and a parity matrix portion corresponding to the parity bits, the parity matrix portion has a stepwise structure, the information matrix portion is indicated by a check matrix initial value table, and the check matrix initial value table is a table indicating positions of elements of "1" of the information matrix portion for each eight columns and is

| | | | | | | | | | |
|---|---|---|---|---|---|---|---|---|---|
| 1 | 7 | 90 | 172 | 209 | 359 | 401 | 420 | 483 | 487 |
| 57 | 164 | 192 | 197 | 284 | 307 | 174 | 356 | 408 | 425 |
| 22 | 50 | 191 | 379 | 385 | 396 | 427 | 445 | 480 | 543 |
| 32 | 49 | 71 | 234 | 255 | 286 | 297 | 312 | 537 | 550 |
| 30 | 70 | 88 | 111 | 176 | 201 | 283 | 322 | 419 | 499 |
| 86 | 94 | 177 | 193 | 266 | 368 | 373 | 389 | 475 | 529 |
| 134 | 223 | 242 | 254 | 285 | 319 | 403 | 496 | 503 | 534 |
| 18 | 84 | 106 | 165 | 170 | 199 | 321 | 355 | 386 | 410 |
| 129 | 158 | 226 | 269 | 288 | 316 | 397 | 413 | 444 | 549 |
| 33 | 113 | 133 | 194 | 256 | 305 | 318 | 380 | 507 | |
| 317 | 354 | 402 | | | | | | | |
| 53 | 64 | 374 | | | | | | | |
| 83 | 314 | 378 | | | | | | | |
| 162 | 259 | 280 | | | | | | | |
| 166 | 281 | 486 | | | | | | | |
| 185 | 439 | 489 | | | | | | | |
| 119 | 156 | 224 | | | | | | | |
| 26 | 62 | 244 | | | | | | | |
| 8 | 246 | 482 | | | | | | | |
| 15 | 72 | 91 | | | | | | | |
| 43 | 69 | 390 | | | | | | | |
| 127 | 186 | 506 | | | | | | | |
| 55 | 81 | 412; | | | | | | | | and decoding the LDPC code, obtained by the demodulating the signal, using the check matrix.

* * * * *